(12) United States Patent
Iizuka

(10) Patent No.: US 7,666,260 B2
(45) Date of Patent: *Feb. 23, 2010

(54) VAPORIZER AND SEMICONDUCTOR PROCESSING APPARATUS

(75) Inventor: Hachishiro Iizuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/556,355

(22) PCT Filed: May 11, 2004

(86) PCT No.: PCT/JP2004/006609

§ 371 (c)(1),
(2), (4) Date: Nov. 10, 2005

(87) PCT Pub. No.: WO2004/100249

PCT Pub. Date: Nov. 18, 2004

(65) Prior Publication Data

US 2007/0101940 A1 May 10, 2007

(30) Foreign Application Priority Data

May 12, 2003 (JP) .............................. 2003-132607
Apr. 16, 2004 (JP) .............................. 2004-121290

(51) Int. Cl.
*C23C 16/00* (2006.01)

(52) U.S. Cl. ..................................................... 118/726

(58) Field of Classification Search .................. 118/726
See application file for complete search history.

(56) References Cited

U.S. PATENT DOCUMENTS

| | | | | |
|---|---|---|---|---|
| 3,888,649 A | * | 6/1975 | Simhan | ..................... 65/60.7 |
| 4,550,706 A | * | 11/1985 | Hoffman | ..................... 123/549 |
| 5,032,461 A | * | 7/1991 | Shaw et al. | ................. 428/461 |
| 5,683,606 A | * | 11/1997 | Ushikoshi et al. | ........... 219/544 |
| 6,074,487 A | * | 6/2000 | Yoshioka et al. | ............. 118/726 |
| 6,144,802 A | * | 11/2000 | Kim | .......................... 392/479 |
| 6,207,239 B1 | * | 3/2001 | Affinito | ...................... 427/488 |
| 6,210,485 B1 | * | 4/2001 | Zhao et al. | ................... 118/724 |
| 6,409,839 B1 | * | 6/2002 | Sun et al. | ..................... 118/726 |
| 6,454,860 B2 | * | 9/2002 | Metzner et al. | ............. 118/715 |
| 2003/0033978 A1 | * | 2/2003 | Zhao et al. | ................... 118/715 |
| 2004/0000379 A1 | * | 1/2004 | Slyke et al. | ................... 159/22 |

FOREIGN PATENT DOCUMENTS

JP          6-310444        11/1994
JP          7-94426         4/1995

(Continued)

*Primary Examiner*—Michael Cleveland
*Assistant Examiner*—Keath T Chen
(74) *Attorney, Agent, or Firm*—Oblon, Spivak, McClelland, Maier & Neustadt, L.L.P.

(57) ABSTRACT

A vaporizer includes a vaporizing chamber configured to vaporize a liquid material and thereby form a gas material. A spray portion is configured to spray the liquid material in the vaporizing chamber. A delivery part is configured to deliver the gas material from the vaporizing chamber to a gas outlet. A heating portion is configured to heat the vaporizer. The delivery part includes a filter member covering the gas outlet and configured to allow the gas material to pass therethrough. A shield plate is disposed to cover the filter member on a side farther from the gas outlet.

30 Claims, 24 Drawing Sheets

FOREIGN PATENT DOCUMENTS

| | | |
|---|---|---|
| JP | 7-310185 | 11/1995 |
| JP | 8-131812 | 5/1996 |
| JP | 2000-119858 | 4/2000 |
| JP | 2001-274145 | 10/2001 |
| JP | 2004-211183 | 7/2004 |

\* cited by examiner

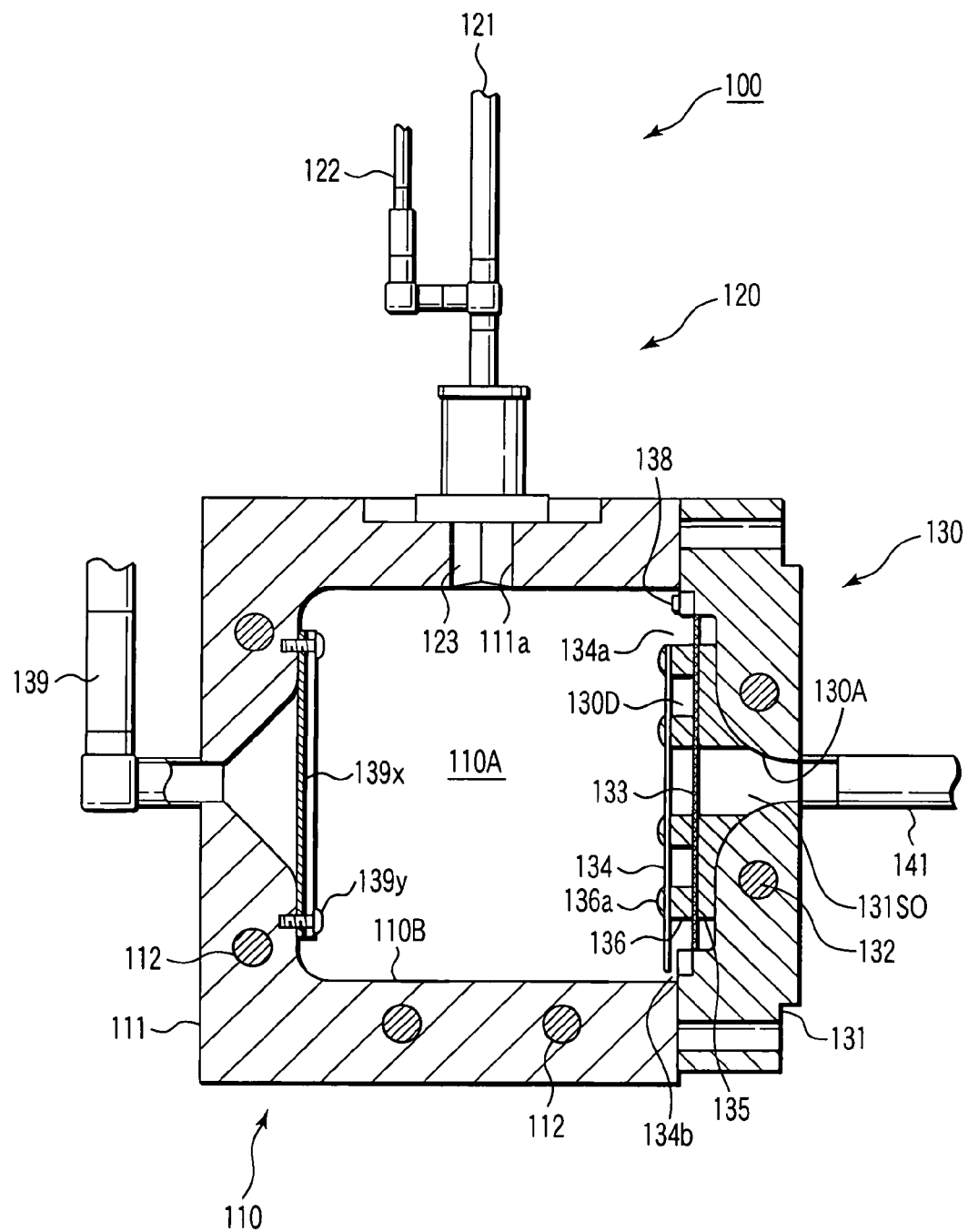
F I G. 1

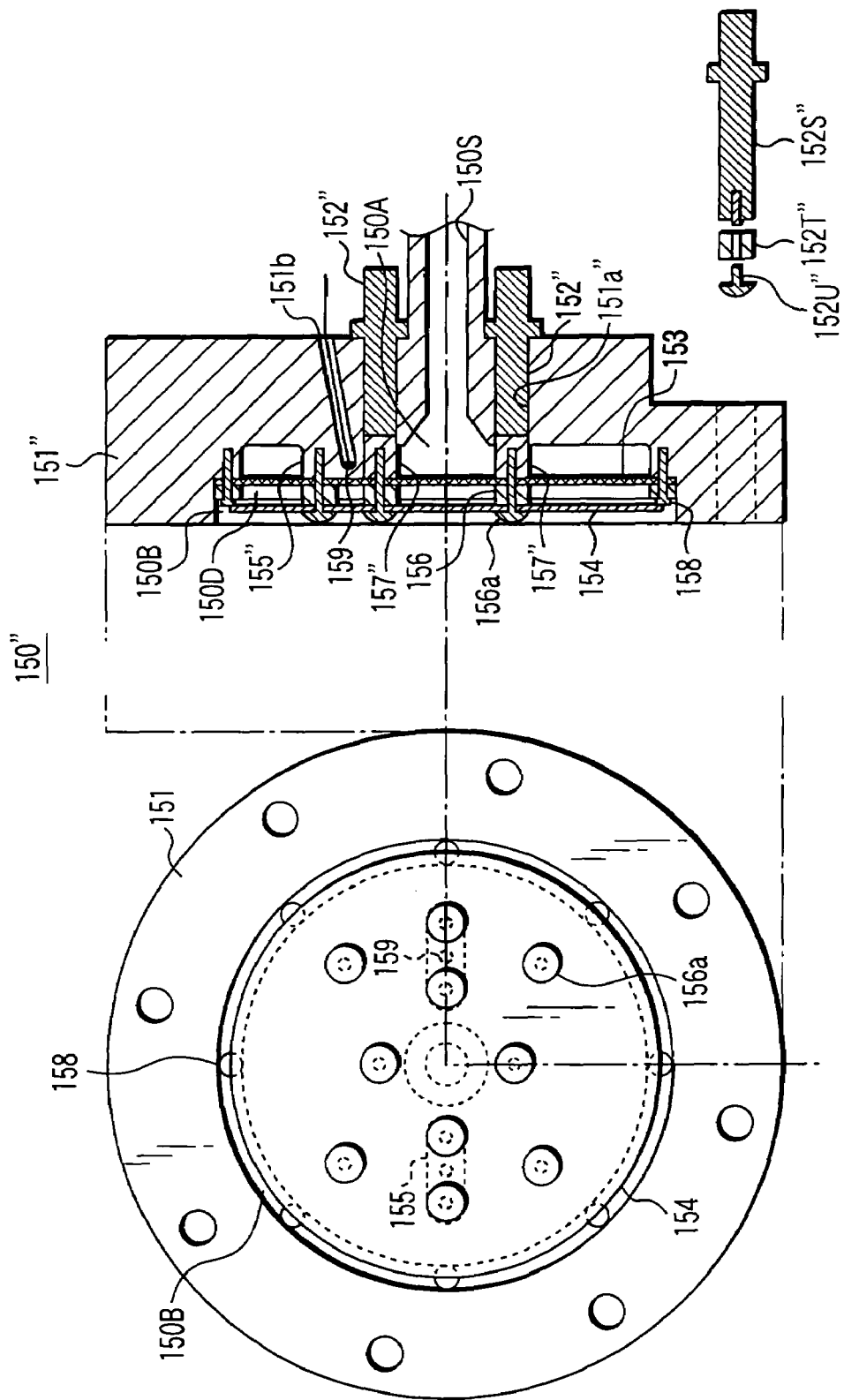

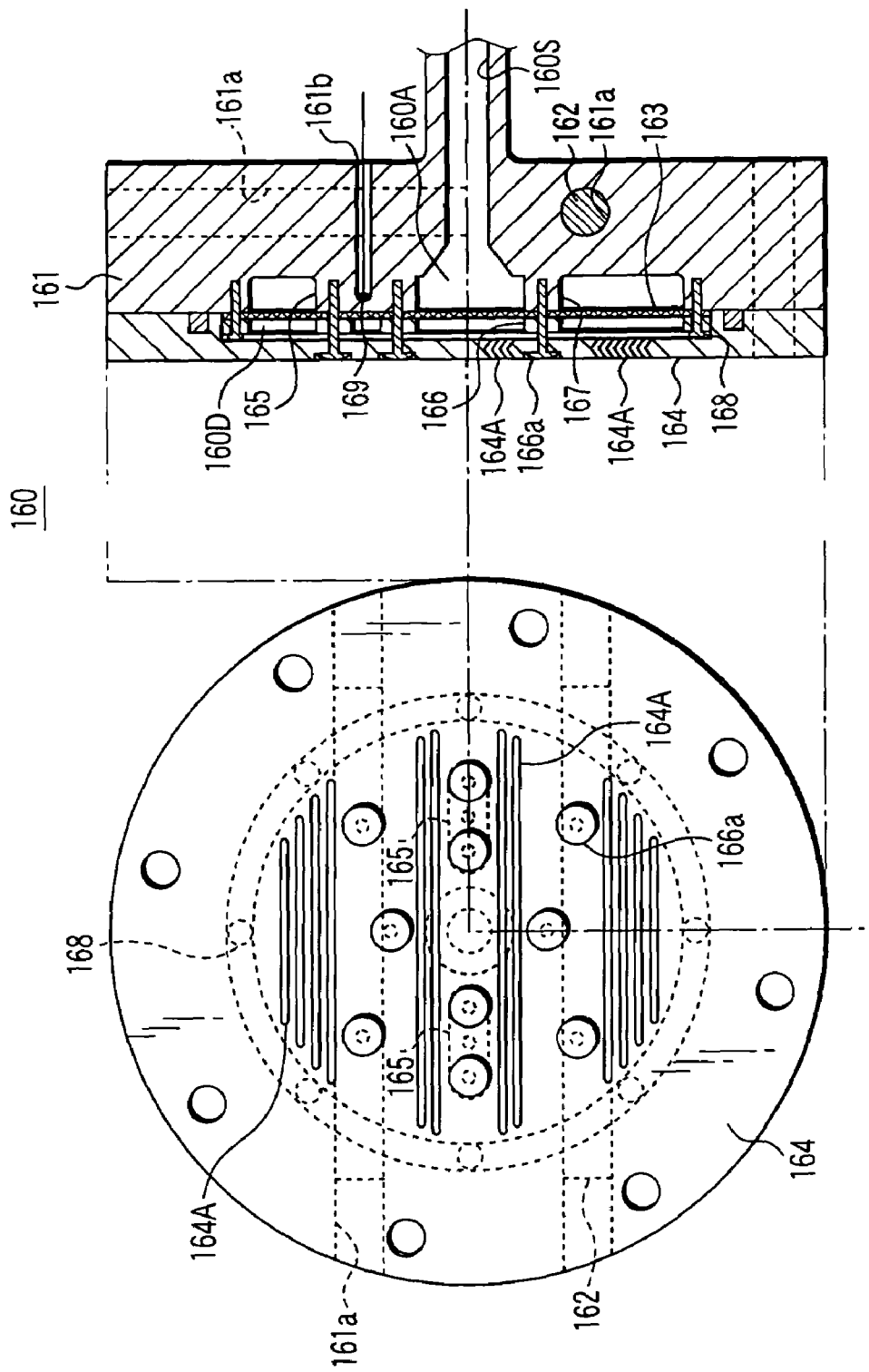

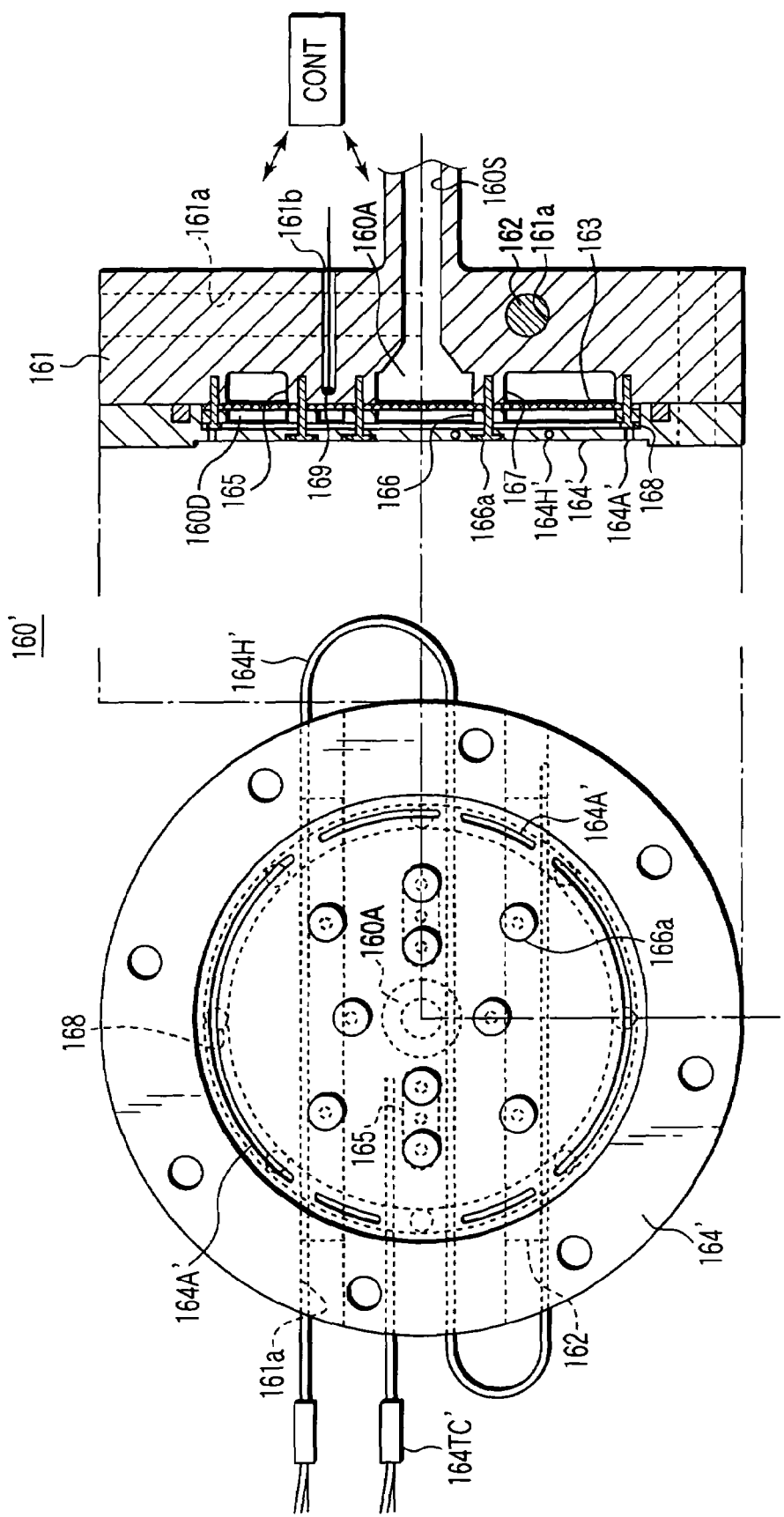

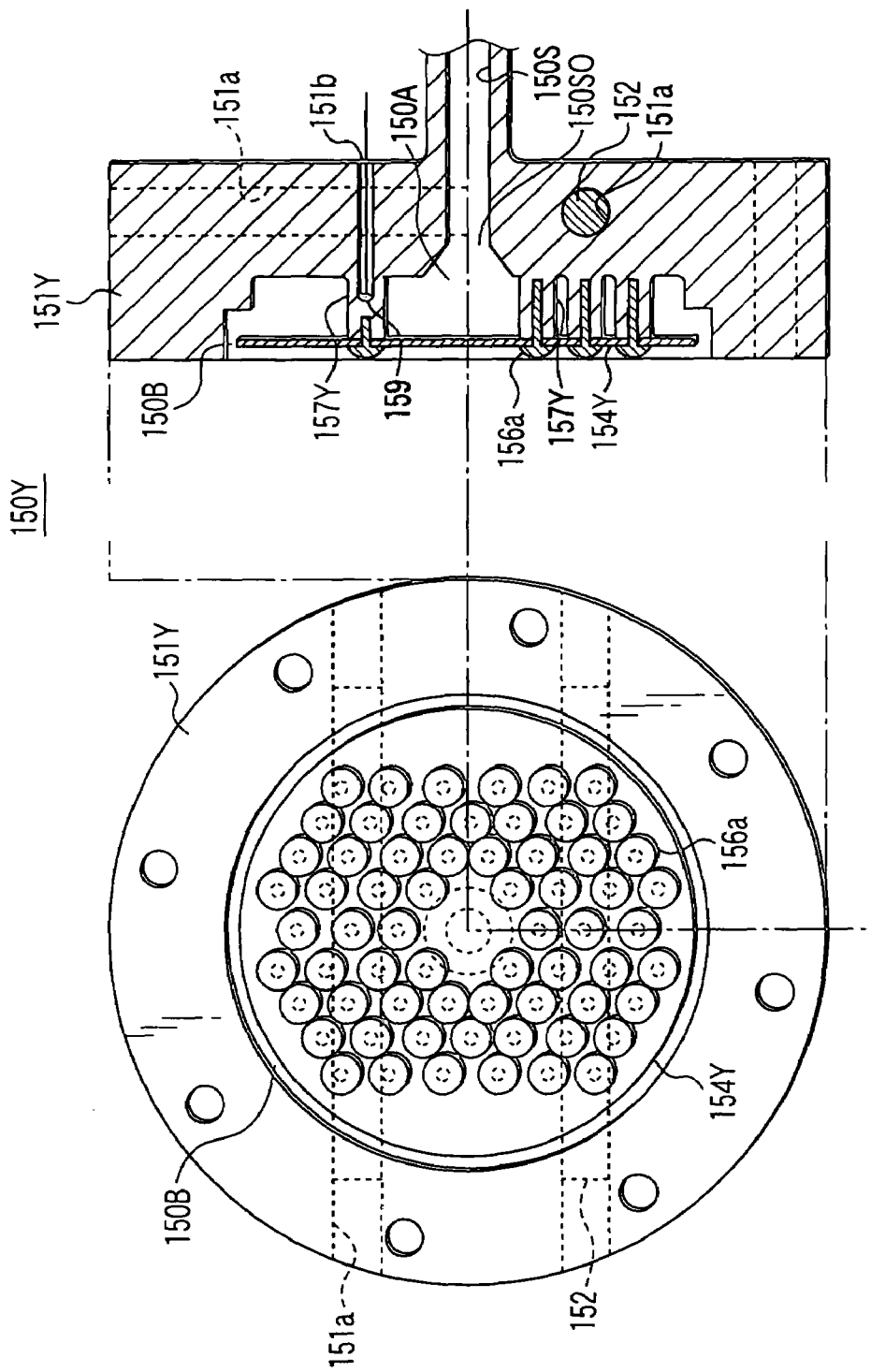
F I G. 9A
F I G. 9B

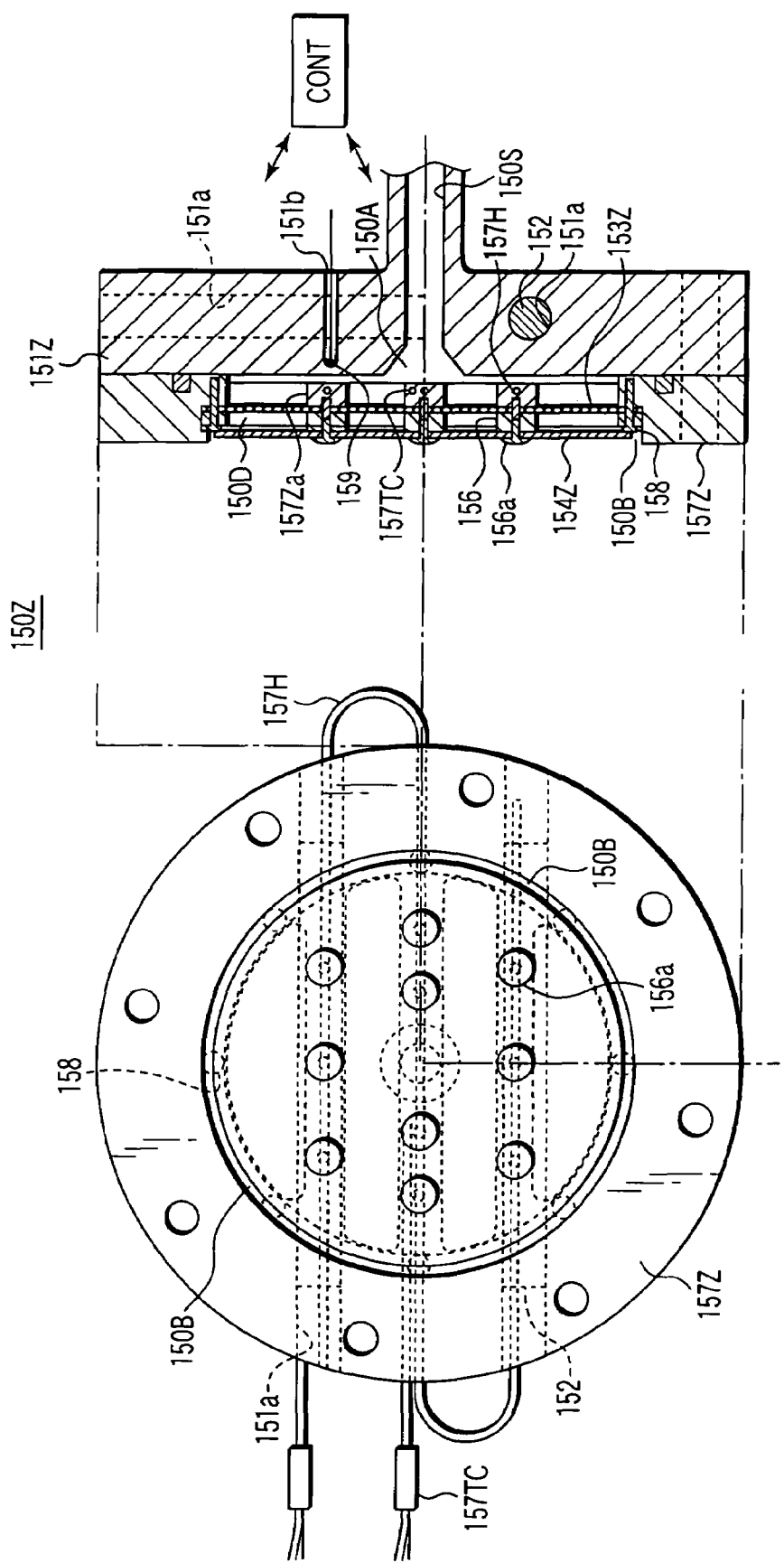

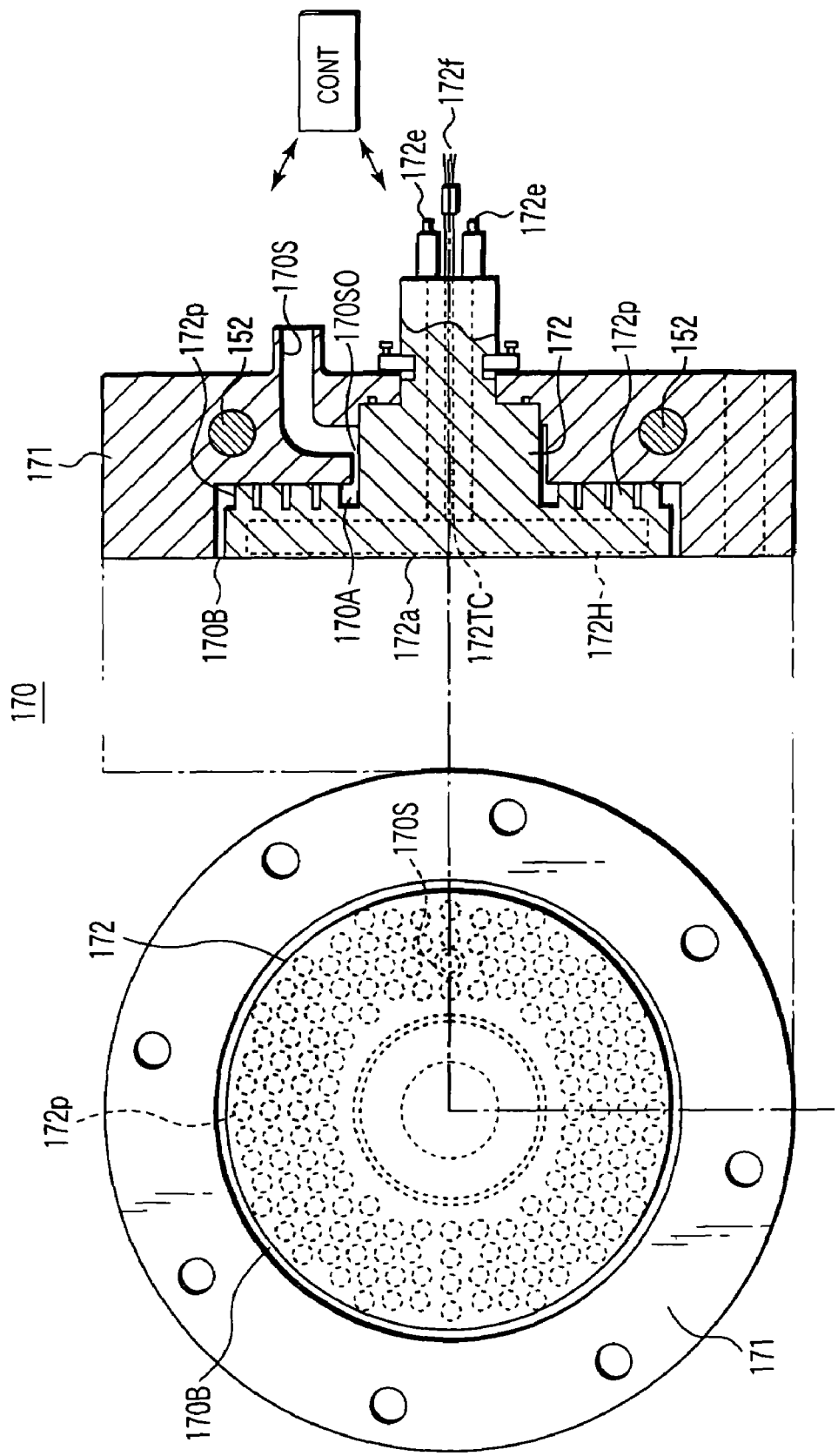

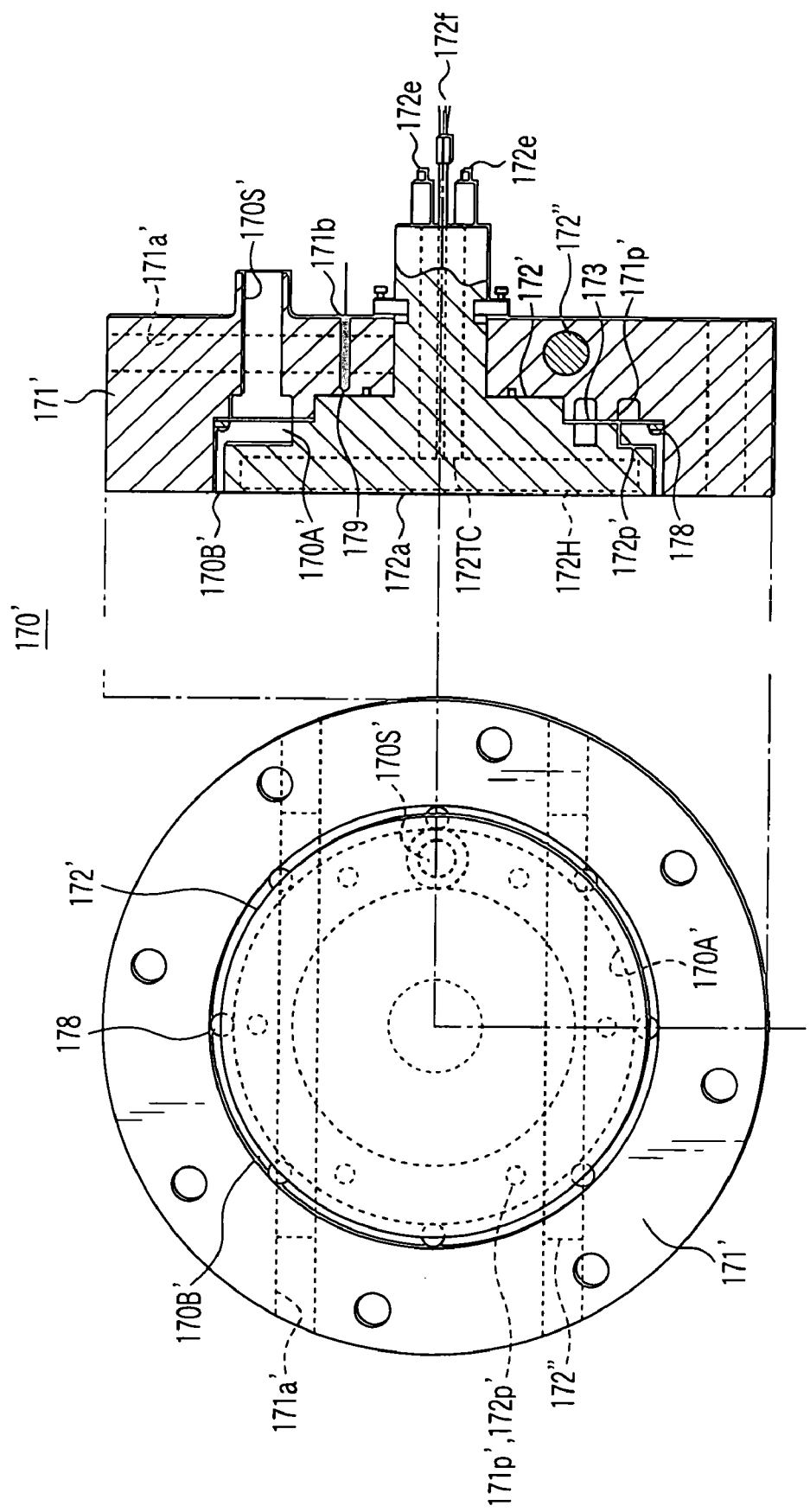

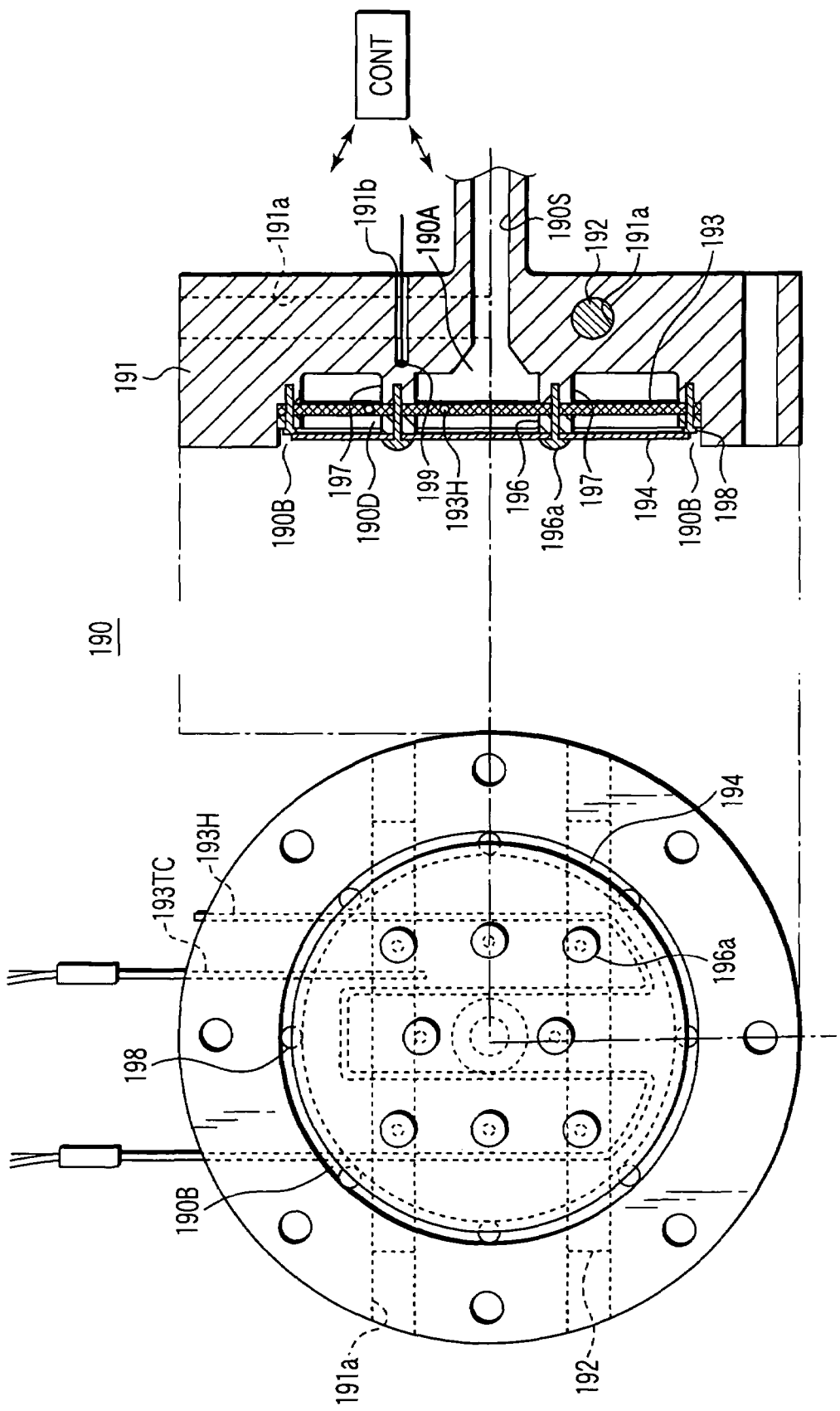

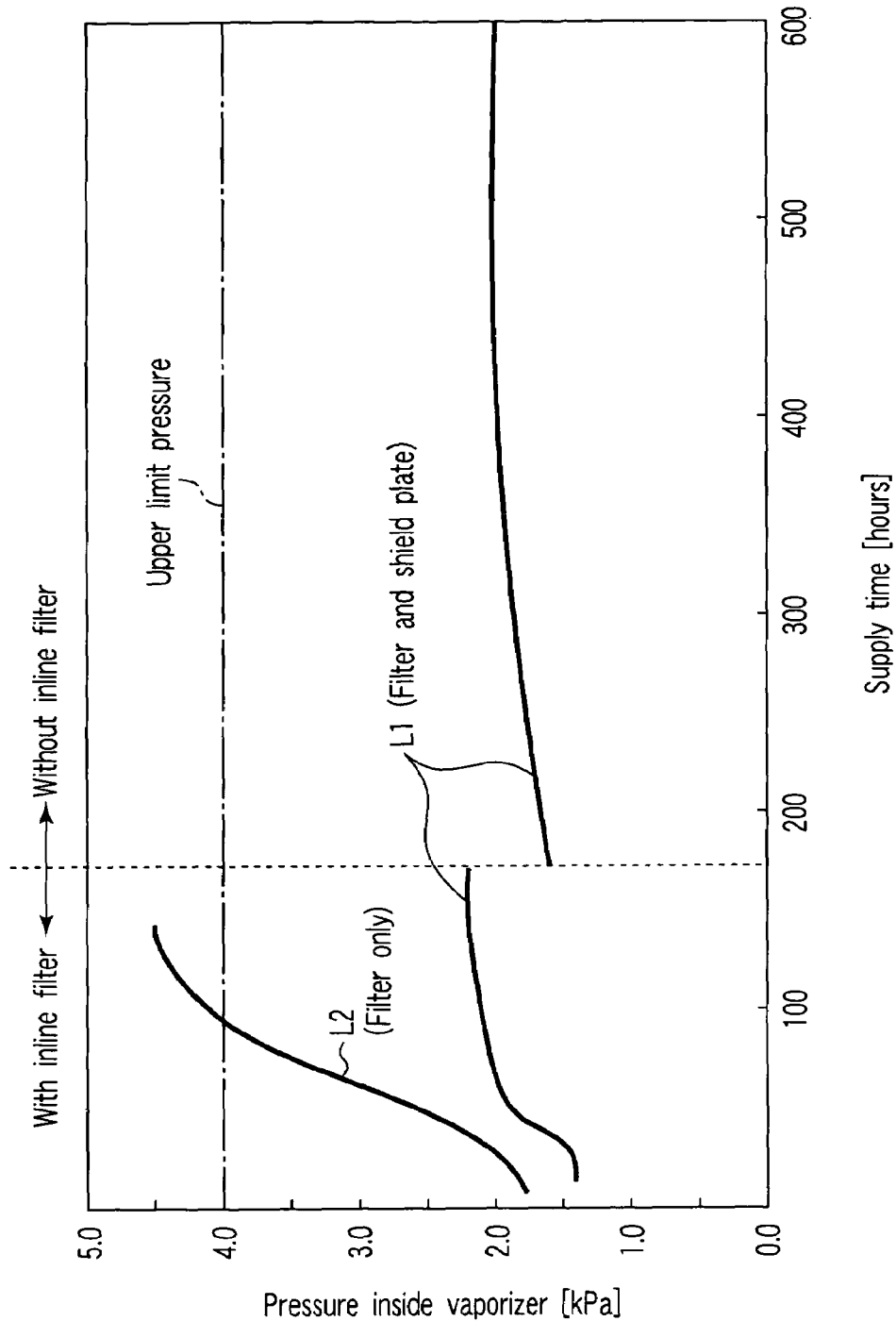
F I G. 24

VAPORIZER AND SEMICONDUCTOR PROCESSING APPARATUS

TECHNICAL FIELD

The present invention relates to a vaporizer for vaporizing a liquid material to generate a gas material, and a semiconductor processing apparatus employing a vaporizer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (liquid crystal display) or FPD (flat panel display), by forming semiconductor layers, insulating layers, and conductive layers in predetermined patterns on the target substrate.

BACKGROUND ART

As exemplary techniques for forming thin films of semiconductor devices, CVD (chemical vapor deposition) methods are known. Where a capacitor is fabricated in a process of manufacturing a semiconductor device, it is required to form a dielectric thin film with a high dielectric constant and a low leakage current, which facilitates high integration of the device. In order to achieve this, a film formation technique employing an organic metal material as a source material is used to form the dielectric thin film.

In such a film formation technique, an organic metal material used as a source material is normally in a liquid state or liquefied by a suitable solvent. The source material is turned into mist and vaporized in a vaporizer (source material vaporizer), and is then supplied into the reaction chamber of a film formation apparatus. In the vaporizer, the organic metal material needs to be sufficiently vaporized at a temperature that does not cause decomposition of the material. However, in practice, non-vaporized residual mist may be generated, and/or decomposition products of the organic metal material may be generated as particles. Accordingly, a problem arises in that the mist and particles degrade the quality of a thin film formed within the reaction chamber.

In light of this problem, conventionally, such a vaporizer is known that includes a filter disposed at the outlet to remove mist and particles (for example, see Jpn. Pat. Appln. KOKAI Publications No. 7-94426 and No. 8-186103 and U.S. Pat. No. 6,210,485). Further, such a vaporizer is known that includes a vaporizing plate disposed at an angle perpendicular to or interfering with the flow path of a gas material, and a heater disposed in the vaporizing plate to promote vaporization (for example, see Pat. Appln. KOKAI Publication No. 6-310444).

Furthermore, such a vaporizer is known that includes a vaporizing surface disposed at a position opposite the spray direction of a source material within a vaporizing chamber and configured to be controlled in temperature independently of the other inner surface portions of the vaporizing chamber (for example, see Pat. Appln. KOKAI Publication No. 2002-110546, and particularly a structure shown in FIGS. 7 and 8 thereof). The vaporizing surface is set at a temperature higher than that of the other inner surface portions. In this respect, conventionally, when a source material is intensively sprayed on an inner surface portion opposite the spray direction of the source material, non-vaporized residuals may be generated due to a temperature decrease of the inner surface portion. In contrast, the improved vaporizer described above can reduce such non-vaporized residuals and thereby increase the vaporization rate.

However, in the conventional gas material supply system described above, a filter may be clogged with mist and particles. In this case, the conductance is decreased in a short time, and the pressure inside a vaporizer is thereby increased. This decreases the gas material feed rate and vaporization efficiency at the vaporizer. Accordingly, in order to maintain the gas material feed rate and vaporization efficiency, the filter requires frequent cleaning or replacement, which in return decreases the operation rate of the apparatus.

According to a conventional system employing the vaporizing plate with a heater disposed therein described above, the vaporizing plate needs to widely expand in a gas passage to increase the trapping rate of mist. In this case, the vaporization efficiency at a vaporizer is decreased. Further, it can be hardly expected that particles are trapped by the vaporizing plate.

Further, according to a conventional vaporizer with the vaporizing surface independently controllable in temperature described above, the temperature of an inner surface portion opposite the spray direction of a source material is independently controlled. With this arrangement, the vaporization efficiency of the source material is increased within a vaporizing chamber. However, this arrangement can hardly work on the mist out of contact with the vaporizing surface. Accordingly, when non-vaporized residuals and particles do not come into contact with the vaporizing surface, but flow directly to the outlet or gas lead-out port of the vaporizing chamber, they can be discharged as they are.

DISCLOSURE OF INVENTION

An object of the present invention is to provide a vaporizer that can decrease mist and particles in a gas material.

In the process of developing the present invention, the inventors studied vaporizers of this kind. As a result, the inventors have arrived at the findings given below.

Specifically, a vaporizer can be arranged to have a first vaporizing region to vaporize and generate a gas material, and a pathway for the gas material to flow thereafter (a second vaporizing region), in which a filter member is disposed and heated to a temperature substantially the same as the heating temperature of the first vaporizing region. With this arrangement, residual mist contained in the gas material is not only trapped, but also re-vaporized. Since residual mist and particles contained in the gas material are trapped, the purity of the gas material to be supplied is increased. Further, the trapped residual mist is re-vaporized by the heated filter member, so the filter member is less clogged. Consequently, the vaporization efficiency at the vaporizer is maintained for a long time period, and the pressure inside the vaporizer is prevented from increasing. Accordingly, maintenance operations can be less frequent, and thus the operation rate of the apparatus is improved.

Incidentally, as a manner of heating a filter member, there may be a case where heating means is disposed outside the filter member to heat the filter member from outside, or a case where heating means is disposed inside the filter member to heat the filter member from inside. In the former case, the filter member is heated by radiation heat and conduction heat. In this case, there is a difficulty in uniformly heating the filter member, because the heating means should not be disposed within the flow path of a gas material. If the temperature of the filter member is less uniform, trapped residual mist is heated less uniformly, and the filter member may be locally clogged.

For example, a filter member may be attached at the peripheral portion thereof, which is heated to a relatively high temperature that does not cause decomposition of a source material. In this case, the central portion of the filter member comes into contact with gas and/or mist and is cooled to a lower temperature. Thus the filter member cannot vaporize mist, but is clogged therewith.

According to a first aspect of the present invention, there is provided a structure for supplying a gas material, comprising: a first vaporizing region configured to vaporize a source material; and a second vaporizing region provided in a pathway of the gas material vaporized by the first vaporizing region, wherein the second vaporizing region comprises an air permeable filter member disposed in the pathway, and a heat transfer portion disposed in thermal contact with the filter member at a position other than a peripheral portion to transfer heat generated by heating means.

According to the first aspect, the source material is once vaporized by the first vaporizing region, and residual mist contained in the gas material is then re-vaporized by the second vaporizing region, so the mist in the gas material is reduced. Further, heat generated by the heating means is transferred by the heat transfer portion to the filter member at a position other than the peripheral portion, so the temperature of the filter member can be uniform, thereby vaporizing mist uniformly or over a larger area on the filter member. Further, the source material is prevented from being locally concentrated and deposited on the filter member, and thus the filter member can be less clogged. In this case, the vaporization efficiency of the vaporizer is prevented from decreasing, and the pressure inside the first vaporizing region is prevented from increasing, so the vaporizer can be continuously operated for a very long time. Further, maintenance operations, such as cleaning and replacement, can be simplified. Furthermore, mist and particles generated in the first vaporizing region are trapped by the filter member, and thus a process using the gas material can be performed with high quality.

For example, the filter member may be formed of a porous structure, a plate structure having a number of fine holes, a structure consisting of packed fibers, or a mesh structure.

A plurality of heat transfer portions are preferably disposed in thermal contact with the filter member at a plurality of positions. With this arrangement, the temperature of the filter member can be more uniform. It is preferable that the heat transfer portions are in thermal contact with the filter member at positions essentially uniformly distributed over the cross section of the pathway (an imaginary plane perpendicular to the flow direction of the gas material). The filter member is preferably heated also at the peripheral portion.

The heat transfer portion may be formed of a projection disposed on the heating means or a member containing the heating means and protruding toward the filter member; an independent member interposed between the heating means or a member containing the heating means and the filter member; or a projection disposed on the filter member protruding toward the heating means or a member containing the heating means. Further, fixing means, such as setscrews, is preferably used to fix at least two of the heating means or a member containing the heating means, the heat transfer portion, and the filter member, to each other.

In this case, temperature control is preferably performed on the basis of the temperature of the heat transfer portion or filter member. Where the temperature of the heat transfer portion or filter member, which receives heat from the heating means, is used to perform temperature control, the temperature of the filter member is improved in controllability. For example, the temperature detection point of a temperature sensor may be disposed in the heat transfer portion or filter member, so that a temperature control circuit or the like can control heating means on the basis of the output of the temperature sensor. Further, the heat transfer portion or filter member may be provided with heating means other than that for the chamber. In this case, it is preferable that the temperature of the heat transfer portion or filter member is controlled by this heating means to be the same as the temperature of the chamber.

According to a second aspect of the present invention, there is provided a structure for supplying a gas material, comprising: a first vaporizing region configured to vaporize a source material; and a second vaporizing region provided in a pathway of the gas material vaporized by the first vaporizing region, wherein the second vaporizing region comprises an air permeable filter member disposed in the pathway, and heating means disposed in the filter member.

According to the second aspect, the heating means is disposed in the filter member, so that the filter member is efficiently heated and becomes less uneven in temperature. The filter member can trap mist and solid substances, and uniformly vaporize residual mist deposited thereon. Consequently, the filter member is prevented from being clogged or generating particles due to residual mist locally deposited thereon.

In the first and second aspects, the first vaporizing region may be formed of a conventionally known vaporizer. This vaporizer may comprise a vaporizing chamber with a heated inner surface, and spray means configured to spray the source material within the vaporizing chamber. Further, the second vaporizing region may be formed of a line filter connected downstream from the vaporizer. The supply structure for a gas material may be arranged such that the first vaporizing region and second vaporizing region are formed in a single vaporizer.

According to a third aspect of the present invention, there is provided a reaction processing apparatus (semiconductor processing apparatus), comprising: a supply structure for a gas material according to any one of the structures described above, and a reaction chamber configured to cause a reaction of the gas material supplied by the supply structure. With this arrangement, the amount of mist and particles, such as solid substances, is reduced in the gas material supplied by the supply structure, so the process quality of the reaction chamber is improved. This reaction processing apparatus widely encompasses various processing apparatuses, which perform a reaction of the gas material within the reaction chamber using energy of a heat source or the like, such as a semiconductor film formation apparatus of the vapor phase growth type, a liquid crystal device film formation apparatus of the vapor phase growth type, a compound semiconductor film formation apparatus of the vapor phase growth type, and a vapor phase etching apparatus. Particularly, in the case of a film formation apparatus of the vapor phase growth type (CVD apparatus), a thin film with high quality can be formed very effectively.

According to a fourth aspect of the present invention, there is provided a vaporizer comprising: a vaporizing chamber configured to vaporize a source material; spray means configured to spray the source material within the vaporizing chamber; and a delivery part opened to the vaporizing chamber and configured to deliver the gas material to a source material feed line, wherein the delivery part comprises an air permeable filter member, and a heat transfer member configured to transfer heat of the heating portion to the filter member.

According to the fourth aspect, residual mist is re-vaporized and solid substances are trapped in the delivery part of the vaporizer. Consequently, it is possible to reduce the amount of mist and solid substances contained in the gas material to be supplied. The heat transfer portion transfers heat from heating means to the filter member at a position other than the peripheral portion, so the filter member becomes less uneven in temperature. Consequently, the filter member provides more uniform re-vaporization effect, and is prevented from suffering local deposition of the source material (or being clogged). Further, mist and particles generated in the vaporizing chamber are trapped, and thus a process using the gas material can be performed with high quality.

In this case, temperature control is preferably performed on the basis of the temperature of the heat transfer portion or filter member. Where the temperature of the heat transfer portion or filter member, which receives heat from the heating means, is used to perform temperature control, the temperature of the filter member is improved in controllability. For example, the temperature detection point of a temperature sensor may be disposed in the heat transfer portion or filter member, so that a temperature control circuit or the like can control heating means on the basis of the output of the temperature sensor. Further, the heat transfer portion or filter member may be provided with heating means other than that for the chamber. In this case, it is preferable that the temperature of the heat transfer portion or filter member is controlled by this heating means to be the same as the temperature of the chamber.

A plurality of heat transfer portions are preferably disposed in thermal contact with the filter member at a plurality of positions. With this arrangement, the temperature of the filter member can be more uniform. It is preferable that the heat transfer portions are in thermal contact with the filter member at positions essentially uniformly distributed over the cross section of the delivery part (a plane perpendicular to the direction from the vaporizing chamber to the delivery part).

According to a fifth aspect of the present invention, there is provided a vaporizer comprising: a vaporizing chamber configured to vaporize a source material; spray means configured to spray the source material within the vaporizing chamber; and a delivery part opened to the vaporizing chamber and configured to deliver the gas material to a source material feed line, wherein the delivery part comprises an air permeable filter member, and heating means disposed in the filter member.

In the fifth aspect, a shield plate is preferably disposed between the interior of the vaporizing chamber and the filter member. The shield plate prevents mist entering from the vaporizing chamber into the delivery part from directly coming into contact with filter member. Consequently, the amount of such residual mist can be reduced that is not vaporized within the vaporizing chamber but directly passes through the delivery part without change. In this case, it is possible to solve a problem in that mist is deposited on the filter member without being vaporized there while the mist draws a large amount heat from the filter member and thereby locally decreases the temperature thereof.

The filter member is preferably detachable by detaching or disassembling only the delivery part. With this arrangement, there is no need to entirely disassemble the other components of the vaporizer, such as the spray means and vaporizing chamber, when detaching and attaching operations are performed for the filter member by detaching or disassembling the delivery part. Consequently, maintenance operations, such as cleaning or replacement, can be easily performed for the filter member.

According to a sixth aspect of the present invention, there is provided a vaporizer comprising: a vaporizing chamber configured to vaporize a source material; spray means configured to spray the source material within the vaporizing chamber; and a delivery part opened to the vaporizing chamber and configured to deliver the gas material to a source material feed line, wherein the vaporizer comprises a shield plate disposed at a position facing the vaporizing chamber to cover the delivery part while ensuring a communication clearance, and a heat transfer portion disposed in thermal contact with the shield plate to transfer heat generated by heating means.

According to the sixth aspect, the shield plate is disposed at a position facing the vaporizing chamber to cover the delivery part, so that residual mist and particles not vaporized within the vaporizing chamber are prevented from directly reaching the delivery part. Consequently, the residual mist and particles reaching a source material feed line can be reduced. Further, heat of the heating means is transferred to the shield plate through the heat transfer portion, so the heated shield plate itself can provide a vaporizing effect. Consequently, the vaporization efficiency is improved by the shield plate that can vaporize residual mist. A gas material vaporized by the vaporizing chamber and shield plate flows through the communication clearance into an internal space of the delivery part, and is then delivered to a source material feed line.

In this case, the heat transfer portion is preferably disposed in thermal contact with the shield plate at a position other than the peripheral portion. With this arrangement, the temperature of the shield plate can be more uniform. Further, temperature control means is preferably disposed to perform temperature control on the basis of the temperature of the heat transfer portion or shield plate.

According to a seventh aspect of the present invention, there is provided a vaporizer comprising: a vaporizing chamber configured to vaporize a source material; spray means configured to spray the source material within the vaporizing chamber; and a delivery part opened to the vaporizing chamber and configured to deliver the gas material to a source material feed line, wherein the vaporizer comprises a shield plate disposed at a position facing the vaporizing chamber to cover the delivery part while ensuring a communication clearance, and heating means disposed in the shield plate.

According to the seventh aspect, the shield plate is disposed at a position facing the vaporizing chamber to cover the delivery part, so that residual mist and particles not vaporized within the vaporizing chamber are prevented from directly reaching the delivery part. Consequently, the residual mist and particles reaching a source material feed line can be reduced. Further, the heating means is disposed in the shield plate, so the heated shield plate itself can provide a vaporizing effect. Consequently, the vaporization efficiency is improved by the shield plate that can vaporize residual mist. A gas material vaporized by the vaporizing chamber and shield plate flows through the communication clearance into an internal space of the delivery part, and is then delivered to a source material feed line.

According to an eighth aspect of the present invention, there is provided a vaporizer comprising: a vaporizing chamber having a vaporizing surface configured to vaporize a source material; spray means configured to spray the source material within the vaporizing chamber; heating means configured to heat the vaporizing surface of the vaporizing chamber; and a delivery part opened to the vaporizing chamber and configured to deliver the gas material to a source material feed line, wherein a shield plate is disposed to face the vaporizing chamber independently of the vaporizing surface and cover the delivery part while ensuring a communication clearance from the vaporizing chamber to the delivery part, the shield plate is configured to be head by the heating means or heating means other than the heating means, and a set temperature of the shield plate is the same as a set temperature of the vaporizing surface.

According to the eighth aspect, the shield plate is heated at the same temperature as the vaporizing surface, so that the shield plate can vaporize mist. Consequently, the shield plate can improve the vaporization efficiency while preventing residual mist and solid substances from entering the delivery part.

In this case, the delivery part is preferably provided with a plurality of heat transfer columns distributed therein and in thermal contact with an inner surface of the delivery part and the shield plate. In this case, residual mist passing through the communication clearance into the delivery part can be trapped and vaporized by the plurality of heat transfer columns that are distributed in the delivery part and in thermal contact with an inner surface thereof and the shield plate. Consequently, it is possible to further improve the vaporization efficiency while reducing particles.

The shield plate is preferably configured to prevent mist from traveling straight on from the vaporizing chamber through the communication clearance into the delivery part. With this arrangement, mist and solid substances passing through the communication clearance into the delivery part are prevented from flowing out downstream. Particularly, when mist enters the delivery part, it comes into contact with the inner surface of the delivery part and is vaporized there, so the vaporization efficiency is further increased.

According to a ninth aspect of the present invention, there is provided a vaporizer comprising: a vaporizing chamber configured to vaporize a source material; spray means configured to spray the source material within the vaporizing chamber; and a delivery part opened to the vaporizing chamber and configured to deliver the gas material to a source material feed line, wherein a filter member is disposed in the delivery part, and a shield plate is disposed at a position facing the vaporizing chamber to cover the filter member while ensuring a communication clearance.

According to the ninth aspect, the filter member is disposed in the delivery part, and the shield plate is disposed at a position facing the vaporizing chamber to cover the filter member. With this arrangement, residual mist and particles are prevented from directly reaching the filter member, and the filter member can be less clogged. Consequently, the heated shield plate can vaporize residual mist, so that the vaporization efficiency is increased, while maintenance operations can be simplified.

According to a tenth aspect of the present invention, there is provided a vaporizer comprising: a vaporizing chamber having a vaporizing surface configured to vaporize a source material; spray means configured to spray the source material within the vaporizing chamber; heating means configured to heat the vaporizing surface of the vaporizing chamber; and a delivery part opened to the vaporizing chamber and configured to deliver the gas material to a source material feed line, wherein a filter member is disposed in the delivery part, a shield plate is disposed on a side of the filter member closer to the vaporizing chamber to face the vaporizing chamber independently of the vaporizing surface and cover the filter member while ensuring a communication clearance from the vaporizing chamber to the delivery part, the filter member and the shield plate are configured to be head by the heating means or heating means other than the heating means, and a set temperature of the filter member and the shield plate is the same as a set temperature of the vaporizing surface.

According to the tenth aspect, the filter member and the shield plate is heated at the same temperature as the vaporizing surface, so that the filter member and the shield plate can vaporize mist. Consequently, the filter member and the shield plate can improve the vaporization efficiency while preventing residual mist and solid substances from entering the delivery part, and reducing the amount of residual mist reaching the filter member by the shield plate.

The shield plate is preferably configured such that, where imaginary straight lines extend from the vaporizing chamber to the communication clearance, no imaginary straight lines can reach the filter member. With this arrangement, such residual mist is reduced that enters the delivery part from the vaporizing chamber through the communication clearance, and directly passes through the filter member. Consequently, the filter member is further prevented from being clogged, and particularly prevented from suffering local concentration of deposit.

An inter-space is preferably formed between the filter member and the shield plate to expand all over the filter member and allow the gas material to pass therethrough. With this arrangement, the gas material entering the delivery part through the communication clearance can pass over the entirety of the filter member, so the conductance for the gas material is ensured. Further, mist and solid substances are prevented from being intensively trapped on a local portion of the filter member, and thus the filter member can be less clogged. In this case, the inter-space between the filter member and shield plate is preferably set to have a distance within a range of 1 to 100 mm, more preferably within a range of 1 to 10 mm, and most preferably at about 5 mm.

The shield plate is preferably disposed to cover the entirety of the filter member, viewing from the vaporizing chamber. With this arrangement, mist and solid substances entering from the vaporizing chamber are prevented from directly reaching the filter member. Particularly, the shield plate is preferably configured to expand outward all around from the peripheral portion of the filter member.

The peripheral portion of the filter member is preferably fixed to the inner surface of the delivery part.

The communication clearance is preferably formed to allow the vaporizing chamber to communicate with the filter member all around the shield plate. With this arrangement, the gas material can flow smoothly through communication clearance to the filter member, while mist and solid substances are being more uniformly trapped on the filter member. In this case, the distance described above is preferably set to be within a range of 0.5 to 10 mm, more preferably to be 10 mm or less, and most preferably at about 2 mm.

The communication clearance is preferably formed around the shield plate. In this case, the shield plate can have a simple structure, and the maintenance operations, such as cleaning of the shield plate and portions near the communication clearance, become simpler. The opening width of the communication clearance (the distance between the shield plate and the inner surface of the delivery part around it) is preferably set to be within a range of 0.5 to 10 mm, and preferably to be not less than 1 mm, and most preferably set at about 2 mm.

The flow path of the gas material from the vaporizing chamber to the delivery part includes a first flow path portion defined by the opening width of the communication clearance, and a second flow path portion defined by the gap between the filter member and shield plate to communicate with the first flow path portion. In this case, the path portions are preferably configured such that mist and solid substances entering through the first flow path portion are prevented from traveling straight on to the second flow path portion. Where the filter member is fixed at the peripheral portion, the flow path of the gas material further includes a third flow path portion defined by the gap between the shield plate and the peripheral portion of the filter member and formed to allow the first and second flow path portions to communicate with each other. In this case, the third flow path portion is preferably configured such that mist and solid substances entering through the first flow path portion are prevented from traveling straight on to the second flow path portion.

The filter member is preferably formed of a plate body having a number of fine holes penetrating therethrough in the flow direction of the gas material. As described above, where the filter member is formed of a simple plate body, heating means can be easily embedded in the filter member. Further, the filter member can have a higher thermal conductivity, so the temperature distribution of the filter member is more uniform. The fine holes preferably have a shape with a penetration distance larger than the opening diameter, e.g. with a diameter of about 0.01 to 1.0 mm, and a penetration distance of about 5 to 15 mm, to ensure the trapping rate of residual mist.

According to an eleventh aspect of the present invention, there is provided a reaction processing apparatus comprising a vaporizer according to any one of the structures described above, and a reaction chamber configured to cause a reaction of the gas material supplied from the vaporizer. With this arrangement, the amount of mist and particles is reduced in the gas material supplied by the vaporizer, so the process quality of the reaction chamber is improved. This reaction processing apparatus widely encompasses various semiconductor processing apparatuses, which perform a reaction of the gas material within the reaction chamber in a certain manner, e.g., adding heat energy, such as a semiconductor film formation apparatus of the vapor phase growth type, a liquid crystal device film formation apparatus of the vapor phase growth type, a compound semiconductor film formation apparatus of the vapor phase growth type, and a vapor phase etching apparatus. Particularly, in the case of a film formation apparatus of the vapor phase growth type (CVD apparatus), this aspect is effectively.

BRIEF DESCRIPTION OF DRAWINGS

FIG. 1 is a schematic sectional view showing the structure of a vaporizer according to a first embodiment of the present invention;

FIGS. 5A and 5B are a schematic inner side view and a schematic sectional side view, respectively, showing the main structure of a vaporizer according to a fourth embodiment of the present invention, and FIG. 5C is a schematic sectional view showing a modification of a heating means;

FIGS. 6A and 6B are a schematic inner side view and a schematic sectional side view, respectively, showing the main structure of a vaporizer according to a fifth embodiment of the present invention;

FIGS. 7A and 7B are a schematic inner side view and a schematic sectional side view, respectively, showing the main structure of a vaporizer according to a sixth embodiment of the present invention;

FIGS. 9A and 9B are a schematic inner side view and a schematic sectional side view, respectively, showing the main structure of a vaporizer according to an eighth embodiment of the present invention;

FIGS. 10A and 10B are a schematic inner side view and a schematic sectional side view, respectively, showing the main structure of a vaporizer according to a ninth embodiment of the present invention;

FIGS. 11A and 11B are a schematic inner side view and a schematic sectional side view, respectively, showing the main structure of a vaporizer according to a tenth embodiment of the present invention;

FIGS. 12A and 12B are a schematic inner side view and a schematic sectional side view, respectively, showing the main structure of a vaporizer according to an eleventh embodiment of the present invention;

FIGS. 14A and 14B are a schematic inner side view and a schematic sectional side view, respectively, showing the main structure of a vaporizer according to a thirteenth embodiment of the present invention;

FIG. 24 is a graph showing change with time in the pressure inside a vaporizing chamber, comparing the vaporizer according to the second embodiment with a conventional vaporizer.

BEST MODE FOR CARRYING OUT THE INVENTION

Figure 2A:
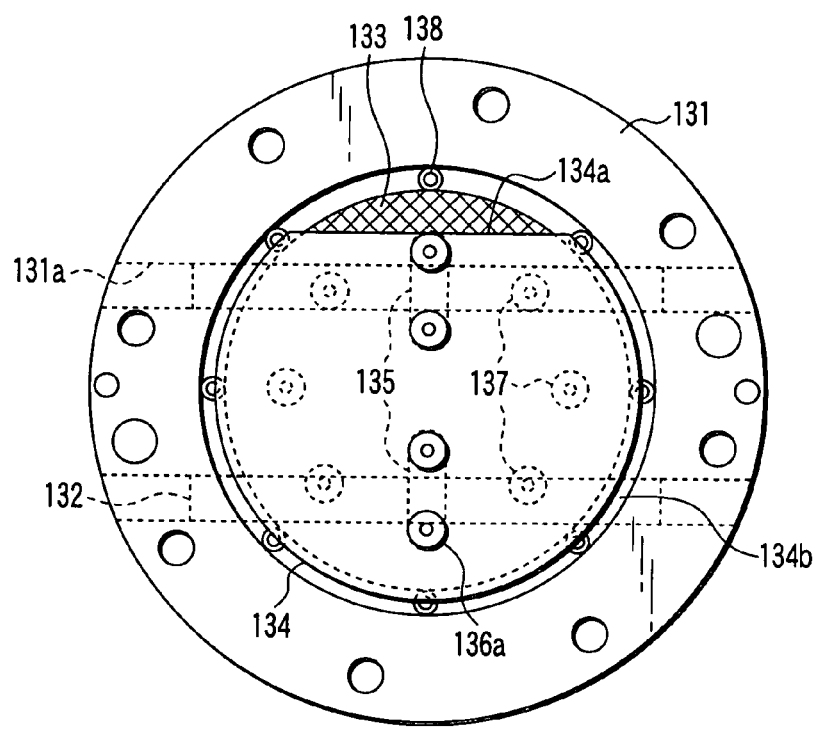
FIG. 2A is a schematic inner side view showing the structure of a delivery part in the vaporizer according to the first embodiment.

Embodiments of the present invention will be described hereinafter with reference to the accompanying drawings. In the following description, the constituent elements having substantially the same function and arrangement are denoted by the same reference numerals, and a repetitive description will be made only when necessary.

FIRST EMBODIMENT

FIG. 1 is a schematic sectional view showing the structure of a vaporizer according to a first embodiment of the present invention. This vaporizer 100 includes a vaporizing chamber 110 that defines a vaporizing surface 110B and a vaporizing space 110A both correspond to a first vaporizing region. Spray means 120 is disposed to spray a liquid material within the vaporizing space 110A. A delivery part 130 corresponding to a second vaporizing region is detachably attached to the vaporizing chamber 110. A detection pipe 139 is disposed for a pressure gauge (capacitance manometer: not shown) to be connected thereto, so as to detect the pressure inside the vaporizing space 110A. A filter member 139$x$ is attached at a port of the vaporizing chamber 110 connected to the pipe 139. The filter member 139$x$ prevents mist and substances from entering the pressure gauge. The filter member 139$x$ is closely fixed to the port rim by an attachment member 139$y$.

The vaporizing chamber 110 has a casing wall 111, and heating means 112, such as heater, embedded in the casing wall 111. The casing wall 111 has a port 111$a$ for the spray means 120 to be connected thereto. The spray means 120 includes a source material supply pipe 121 for supplying a source material or liquid material, which consists of an organic metal source material, or which has been prepared by dissolving an organic metal source material in a solvent. The spray means 120 further includes a spray gas supply pipe 122 for supplying a spray gas, such as argon gas, (Ar, or, e.g., Ne or $N_2$), and a spray nozzle 123 for spraying the source material as mist. The spray nozzle 123 is configured to spray the source material (liquid, such as an organic metal material) and spray gas from individual fine ports, so as to atomize the material.

The delivery part 130 is configured to deliver the gas material vaporized in the vaporizing space 110A to a feed line 141. The delivery part 130 includes a sidewall 131, which is recessed on a side facing the vaporizing space 110A to form an internal space 131SO. Columnar heat transfer portions protrude within the internal space 131SO. Heating means 132 such as a heater is embedded in the sidewall 131 (in reception holes 131$a$ in FIG. 2). The internal space 131SO of the delivery part 130 communicates with the vaporizing space 110A and feed line 141. The delivery part 130 can be disposed on any side of the vaporizing space 110A, as long as it faces the vaporizing space 110A.

A filter member 133 is disposed inside the internal space 131SO to cover a delivery port (gas outlet) 131A connected to the feed line 141. The filter member 133 may be formed of an air permeable filter plate. For example, the filter member may be formed of a porous material, a filter plate with a number of fine holes, a material consisting of packed fibers, or a mesh material. More specifically, the filter material may be a non-woven or sintered body formed of packed metal fibers (for example, stainless steel fibers), which can withstand a high temperature (for example, it is within a range of about 180° C. to 350° C. and suitably set in accordance with the evaporation temperature and decomposition temperature of the source material). For example, the metal fibers have a diameter of about 0.1 to 3.0 mm. Particularly, it is preferable to use a sintered material prepared by sintering granular bodies, such as spherical bodies, having a high thermal conductivity. The granular bodies may be made of a material selected from the group consisting of non-metal materials, such as a ceramic and quartz; stainless steel; nonferrous metal materials, such as aluminum, titanium, and nickel; and alloys of these materials. These matters concerning the structure and material of the filter member are common to the following embodiments.

FIG. 2A is an inner side view showing the delivery part 130, viewing from the vaporizing space 110A. The filter member 133 is in contact with the sidewall 131 and connected and fixed thereto at the peripheral portion, to completely cover the opening section of the internal space 131SO. Specifically, the peripheral portion of the filter member 133 is fixed to the sidewall 131 by setscrews 138 or the like. Heat transfer portions 135 and 137 protrude inward from the sidewall 131 at positions separate from the peripheral portion of the filter member 133. The heat transfer portions 135 and 137 provide thermal contact of the filter member 133 with the sidewall 131. The heat transfer portions 135 and 137 also serve as support members for supporting the filter member 133. The heat transfer portions 135 and 137 are made of a metal (such as stainless steel) having a high thermal conductivity. Each of the heat transfer portions 135 is a column with an elliptical cross-section. Each of the heat transfer portions 137 is a column with a circular cross-section. In this embodiment, the heat transfer portions 135 and 137 are heated by the heating means, such as a heater, embedded in the sidewall 131. However, the heat transfer portions may be formed of heating means, or provided with heating means embedded therein.

A shield plate 134 is disposed at a side of the filter member 133 facing the vaporizing space 110A. The shield plate 134 is made of a thermally conductive metal material, such as stainless steel. The shield plate 134 faces the vaporizing space 110A to prevent source material mist sprayed by the spray nozzle 123 from directly coming into contact with the filter member 133. With this arrangement, the temperature decrease of the filter member 133 is suppressed to reliably vaporize mist thereon, so the filter member 133 is prevented from being clogged. The shield plate 134 is disposed to cover the filter member 133 essentially in plane. An inter-space (or gas passage) 130D is formed between the shield plate 134 and filter member 133 to expand all over the filter member 133 and allow the vaporized source material to diffuse or pass therethrough. The inter-space 130D is heated by the shield plate 134 and filter member 133 being heated by the heat transfer portions 135 and 137.

A communication clearance 134$b$ is formed around the shield plate 134 for the vaporizing space 110A and internal space 131SO to communicate with each other, so as to efficiently send the vaporized source material therethrough. An opening 134$a$ is formed in the shield plate 134 on a side near the spray nozzle 123. The opening 134$a$ increases the area of the communication clearance, so that the gas material can easily flow from the vaporizing space 110A to the internal space 131SO behind the filter member 133. The opening 134$a$ is formed here, because the spray nozzle 123 has an essentially limited spray angle range, with which the mist sprayed by the spray nozzle 123 can hardly reach the delivery part 130 directly.

Figure 2B:
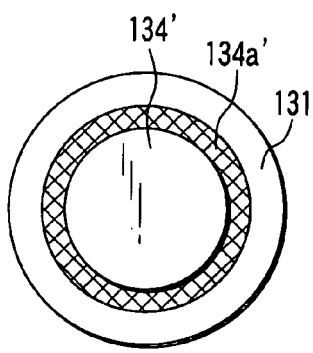
FIGS. 2B, 2C, and 2D are inner side views respectively showing modifications according to the first embodiment.
Figure 2C:
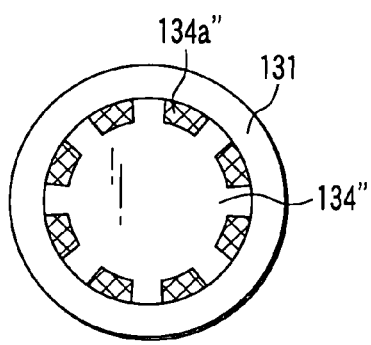
Figure 2D:
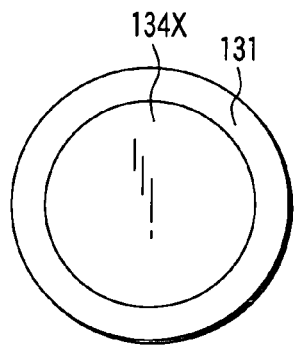

FIGS. 2B, 2C, and 2D are inner side views respectively showing modifications of the shield plate. FIG. 2B shows a shield plate 134' provided with opening 134a' continuously or entirely extending all around over the filter member 133. FIG. 2C shows a shield plate 134" provided with a plurality of openings 134a" separately formed therein all around the filter member 133. The shield plate may be provided with slit-like openings (including a case where they are concentrically formed).

FIG. 2D shows a shield plate 134X provided with no openings formed therein, and thus covering the entirety of the filter member 133. In this case, the communication clearance 134b around the shield plate (see FIGS. 1 and 2A) is formed to provide a sufficient communication between the vaporizing space 110A and internal space 131SO. Where the shield plate 134X entirely covers the filter member 133, as shown in FIG. 2D, it is advantageous to prevent residual mist of the source material from being directly deposited on the filter member 133.

The shield plate 134 and filter member 133 with spacers 136 interpose therebetween, are fixed together to the heat transfer portions 135. The spacers 136 are made of a material having a high thermal conductivity, such as a metal, e.g., Al or stainless steel, or a ceramic. Setscrews 136a are used as fixing means for fixing the shield plate 134 and spacers 136 to the heat transfer portions 135. The same fixing means are also used for fixing the filter member 133 to the heat transfer portions 137. The filter member 133 and shield plate 134 are set in thermal contact with the heating means 132 through the heat transfer portions 135 and spacers to receive heat generated by the heating means 132. The filter member 133 and shield plate 134 are also heated by radiation heat received from the inner surface of the casing wall 111 of the vaporizing chamber 110 that faces the vaporizing space 110A.

In this embodiment, the source material is supplied through the source material supply pipe 121 and sprayed from the spray nozzle 123 into the vaporizing space 110A. Part of the mist of the source material thus sprayed is vaporized while flying, and other part arrives at the inner surface of the casing wall 111 heated by the heating means 112, and is heated and vaporized thereon. In order to vaporize the source material, the vaporizing chamber 110, particularly the inner surface of the casing wall 111, is heated by the heating means 112 to a temperature within a range from a value lower than the decomposition temperature of the source material to a value higher than the evaporation temperature of the source material. This temperature is set to be within a range of, e.g., about 100 to 350° C.

The gas material thus generated in the vaporizing space 110A passes through the filter member 133 from around the shield plate 134 and enters the internal space 131SO. When the gas material flows to the internal space 131SO, it contains fine residual mist that has not being vaporized in the vaporizing space 110A. The residual mist is trapped by the filter member 133, and is heated and re-vaporized by heat transferred to the filter member 133 from the heating means 132 through the heat transfer portions 135 and 137. The filter member 133 is preferably heated to a temperature within substantially the same range as that of the vaporizing chamber.

The heat transfer portions 135 and 137 are preferably disposed with essentially uniform distribution over the entire cross section of the filter member 133 across the flow path of the gas material. With this arrangement, the filter member 133 can be more uniformly heated to improve the vaporization efficiency of the residual mist, and thereby allow the filter member to be less clogged.

In the example shown in the figure, the peripheral portion of the filter member is in contact with (connected and fixed to) the inner surface of the delivery part, and receives heat from the inner surface. The heat transfer portions may be provided with heating means to heat the filter member.

The shield plate 134 prevents the mist sprayed by the spray nozzle 123 from directly reaching the filter member 133. In this case, it is possible to solve such a problem that effective vaporization of deposited mist is locally deteriorated at certain portions of the filter member 133 due to heat loss caused by excess mist. Consequently, the shield plate 134 prevents the filter member 133 from being clogged at these portions, which may reduce the delivery amount of gas material and increase the pressure inside the vaporizing chamber.

In the embodiment described above, the delivery part 130 is arranged such that the sidewall 131 is detachable from the casing wall 111 to easily pick up the filter member 133. Accordingly, if there is a problem with the filter member 133, such as clogging, the filter member 133 can be easily and swiftly detached for cleaning or replacement with new one. With this arrangement, the maintenance operation time is shorter, which improves the operation rate and process yield of the apparatus.

In this embodiment, the shield plate 134 is heated by heat transferred through the heat transfer portions 135 and 137. Accordingly, when the source material mist within the vaporizing chamber 110A comes into direct contact with the shield plate 134, the mist is vaporized also on the surface of the shield plate 134. However, when the mist is vaporized on the shield plate 134, the vaporization heat thereof decreases the temperature of the shield plate 134. This decrease in the temperature of the shield plate 134 changes with change in the amount of mist coming into contact with shield plate 134, which depends on the amount of sprayed liquid material. In general, the temperature of the shield plate 134 becomes about 5 to 15° C. lower than the set temperature of the vaporizing chamber 110.

The filter member 133 is only required to be disposed close to the shield plate 134 on the side facing the delivery passage. For example, typically, the inter-space 130D between the filter member 133 and shield plate 134 is set to have a distance within a range of 1 to 100 mm, preferably within a range of 1 to 50 mm, and more preferably within a range of 2 to 10 mm. Typically, the distance is most preferably set at about 5 mm. If the distance is smaller than that within the range, the conductance for the gas material is too low, and the substantial range of the filter member 133 for residual mist to be deposited thereon becomes too narrow. In this case, solid substances may be intensively deposited on a specific portion of the filter member 133. As the distance is larger, the conductance for the gas material is increased and local deposition of solid substances on the filter member 133 is thereby suppressed, but the size of the vaporizer needs to be increased.

The communication clearance 134b, or distance between the peripheral portion of the shield plate 134 and the sidewall 131 around the edge portion, has an opening width which is preferably set to be within a range of 0.5 to 10 mm, and more preferably to be not less than 1 mm, to ensure the conductance for the gas material. However, if the opening width is too large, mist is more likely to directly reach the filter member 133. Accordingly, the opening width is most preferably set at about 2 mm.

The distance between the peripheral portion of the shield plate 134 and the peripheral portion of the filter member 133 on the internal space 131SO side (the flow path width in the internal space 131SO) is preferably set to be within a range of 0.5 to 100 mm, and more preferably within a range of 0.5 to 10 mm. The distance is most preferably set at about 2 mm. As the distance is smaller, the conductance for the gas material is decreased. Conversely, as the distance is larger, mist entering through the communication clearance 130B is more likely to directly reach the filter member 133.

The flow path of the gas material from the vaporizing chamber 110A to the delivery part 130 includes a first flow path portion defined by the opening width of the communication clearance 134b, and a second flow path portion defined by the gap between the filter member 133 and shield plate 134 to communicate with the first flow path portion. In this case, the path portions are preferably configured such that mist and solid substances entering through the first flow path portion are prevented from traveling straight on to the second flow path portion. Where the filter member 133 is fixed at the peripheral portion, the flow path of the gas material further includes a third flow path portion defined by the gap between the shield plate 134 and filter member 133 and formed to allow the first and second flow path portions to communicate with each other. In this case, the third flow path portion is preferably configured such that mist and solid substances entering through the first flow path portion are prevented from traveling straight on to the second flow path portion.

SECOND EMBODIMENT

Figures 3A, 3B:
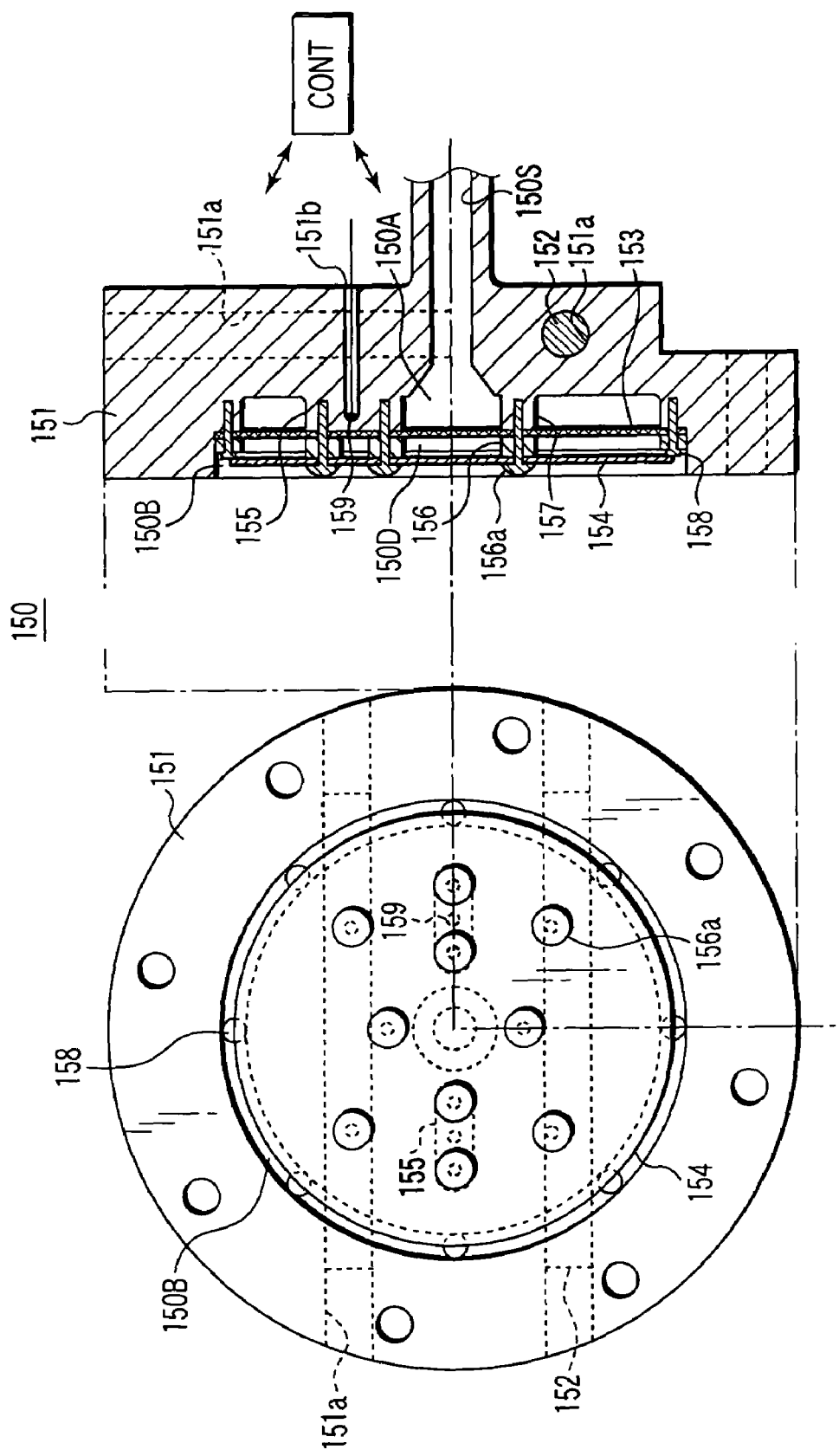
FIGS. 3A and 3B are a schematic inner side view and a schematic sectional side view, respectively, showing the main structure of a vaporizer according to a second embodiment of the present invention.

FIGS. 3A and 3B are a schematic inner side view and a schematic sectional side view, respectively, showing the main structure of a vaporizer according to a second embodiment of the present invention. FIGS. 3A and 3B show a delivery part 150 usable in place of the delivery part 130 of the vaporizer shown in FIG. 1. The other portions of the second embodiment are the same as those of the first embodiment.

In this embodiment, the delivery part 150 includes a sidewall 151, which is recessed on a side facing the vaporizing space to form an internal space 150A. Heat transfer portions 155 and 157 protrude from the sidewall 151 within the internal space 150A. Heating means 152 the same as that described above is embedded in the sidewall 151 (in reception holes 151a). The internal space 150A communicates with a delivery passage 150S. A filter member 153 the same as that described above is disposed within the internal space 150A. The filter member 153 is thermal contact with the heat transfer portions 155 and 157 protruding from the inner surface of the sidewall 151, as in the first embodiment. Each of the heat transfer portions 155 is a column with an elongated cross-section, such as an elliptical cross-section. Each of the heat transfer portions 157 is a column with a circular cross-section. Each of these columnar portions can have any shape as long as it can make face contact with the filter member 153 and shield plate 154 to easily transfer heat. For example, the sectional shape of each columnar portion may be rhombic, triangle, star-shaped, rectangle, or circular. The peripheral portion of the filter member 153 is fixed to the sidewall 151 by setscrews 158 or the like. The number and position of the heat transfer portions 155 and 157 are set to uniformly transfer heat to the filter member 153.

A shield plate 154 is attached and fixed to the heat transfer portions 155 and 157 by setscrews 156a, with spacers 156 interposed therebetween. An inter-space 150D is formed between the shield plate 154 and filter member 153 to expand all over the filter member 153. The shield plate 154 is disposed on the delivery part 150 to face the vaporizing chamber. The shield plate 154 is circular in the plan view. The shield plate 154 is disposed to cover the filter member 153 entirely in plane. A communication clearance 150Bb is formed of an annular gap between the peripheral portion of the shield plate 154 and the sidewall 151 around the shield plate 154. As described above, the shield plate 154 covers the filter member 153 entirely in plane, so that the mist source material cannot directly come into contact with the filter member 153 to prevent the filter member 153 from being clogged and suffering local concentration of deposit. Consequently, pressure increase inside the vaporizing chamber is suppressed and the filter service life is prolonged, while residual mist and particles are prevented from being delivered downstream.

The respective portions described above are configured basically the same as those of the first embodiment. Accordingly, the filter member 153 is arranged to receive not only heat of the heating means 152 directly from the sidewall 151 at the peripheral portion, but also heat of the heating means 152 through the heat transfer portions 155 and 157 disposed in thermal contact with portions other than the peripheral portion. The shield plate 154 is heated by the filter member 153 and the heat transfer portions 155 and 157 through the spacers 156.

In this embodiment, the gas material vaporized in the vaporizing chamber passes through the communication clearance 150B into the inter-space 150D of the delivery part 150. Then, the gas material passes through the filter member 153 and is delivered from the interior space 150A into a feed line 150S.

The communication clearance 150B is configured such that, where imaginary straight lines extend from the vaporizing chamber to the communication clearance 150B, no imaginary straight lines can directly reach the filter member 153. In other words, even if residual mist within the vaporizing chamber enters the delivery part 150 through a straight flight route, the residual mist cannot be directly deposited onto the filter member 153. Further, the mist source material cannot come into direct contact with the filter member 153. Specifically, the opening width of the communication clearance 150B in the radial direction is set to prevent any linear flight route passing through the communication clearance 150B from reaching the filter portion of the filter member 153.

The parameters of the respective portions of the delivery part 150 are the same as those of the first embodiment. For example, the opening width of the communication clearance 150B in the radial direction is set at 2 mm, the distance between the shield plate 154 and the peripheral portion of the filter member 153 in the axial direction is set at 2 mm, the distance between the shield plate 154 and the filter portion of the filter member 153 in the axial direction is set at 5 mm, the width of the peripheral portion of the filter member 153 in the radial direction is set at 4 mm, and the distance between the outer edge position of the shield plate 154 and the substantial outer edge position of the filter member 153 (i.e., the outer edge position of the filter portion) in the radial direction is set at 2 mm. With this arrangement, the amount of deposit on the filter member 153 can be reduced to prevent the filter member 153 from being clogged and suffering concentration of deposit. Particularly, concentration of deposit on the peripheral portion of the filter member 153 can be suppressed.

In this embodiment, a temperature sensor (for example, thermocouple) 159 is inserted in a hole 151b formed in the sidewall 151, and the detection point thereof is disposed in the heat transfer portion 155 having an elongated shape in the plan view. With this arrangement, the temperature of the heat transfer portions 155, i.e., a temperature at a position very close to the filter member 153 can be detected. The output of the temperature sensor 159 is connected to, e.g., a temperature control circuit CONT, which is configured to control the heating means 152 on the basis of the output of the temperature sensor 159. This temperature is preferably controlled on the basis of the output of the temperature sensor 159, to be the same temperature as the other heating means of the vaporizer (the heating means of the vaporizing chamber). The heating means 152 may be controlled independently of the other heating means 112 of the vaporizing chamber such that the heat transfer portions 155, filter member 153, and casing wall 111 have the same temperature. With this arrangement, the temperature of the filter member 153 and shield plate 154 can be precisely controlled. Consequently, the filter member 153 is prevented from being clogged, and the pressure increase inside the vaporizing chamber is suppressed. Further, the residual mist and particles can be reduced.

In this embodiment, the temperature of the heat transfer portions 155 is detected to control the heating means 152, so the temperature controllability of the filter member 153 and shield plate 154 is improved as compared to the first embodiment. Thus the temperature decrease of the shield plate 154 is suppressed, as compared with the first embodiment. In this case, the set temperature of the heating means 152 is preferably set to be the same as the set temperature of the vaporizing chamber.

The filter member 153 is only required to be disposed close to the shield plate 154 on the side facing the delivery passage 150S. For example, typically, the distance between the filter member 153 and shield plate 154 is set to be within a range of 1 to 100 mm, preferably within a range of 1 to 50 mm, and more preferably within a range of 2 to 10 mm. Typically, the distance is most preferably set at about 5 mm. If the distance is smaller than that within the range, the conductance for the gas material is too low, and the substantial range of the filter member 153 for residual mist to be deposited thereon becomes too narrow. In this case, solid substances may be intensively deposited on a specific portion of the filter member 153. As the distance is larger, the conductance for the gas material is increased and local deposition of solid substances on the filter member 153 is thereby suppressed, but the size of the vaporizer needs to increase. These matters are common to the respective embodiments described later.

The communication clearance 150B, or distance between the peripheral portion of the shield plate 154 and the sidewall 151 around the edge portion, has an opening width which is preferably set to be within a range of 0.5 to 10 mm, and more preferably to be not less than 1 mm, to ensure the conductance for the gas material. However, if the opening width is too large, mist is more likely to directly reach the filter member 153. Accordingly, the opening width is most preferably set at about 2 mm. These matters are common to the respective embodiments described later.

The distance between the peripheral portion of the shield plate 154 and the peripheral portion of the filter member 153 on the internal space 150A side (the flow path width in the internal space 150A) is preferably set to be within a range of 0.5 to 100 mm, and more preferably within a range of 0.5 to 10 mm. The distance is most preferably set at about 2 mm. As the distance is smaller, the conductance for the gas material is decreased. Conversely, as the distance is larger, mist entering through the communication clearance 150B is more likely to directly reach the filter member 153. These matters are common to the respective embodiments described later.

The flow path of the gas material from the vaporizing chamber to the delivery part 150 includes a first flow path portion defined by the opening width of the communication clearance 150B, and a second flow path portion (the interspace 150D) defined by the gap between the filter member 153 and shield plate 154 to communicate with the first flow path portion. In this case, the path portions are preferably configured such that mist and solid substances entering through the first flow path portion are prevented from traveling straight on to the second flow path portion. Where the filter member 153 is fixed at the peripheral portion, the flow path of the gas material further includes a third flow path portion defined by the gap between the shield plate 154 and filter member 153 to allow the first and second flow path portions to communicate with each other. In this case, the third flow path portion is preferably configured such that mist and solid substances entering through the first flow path portion are prevented from traveling straight on to the second flow path portion. These matters are common to the respective embodiments described later.

THIRD EMBODIMENT

Figures 4A, 4B:
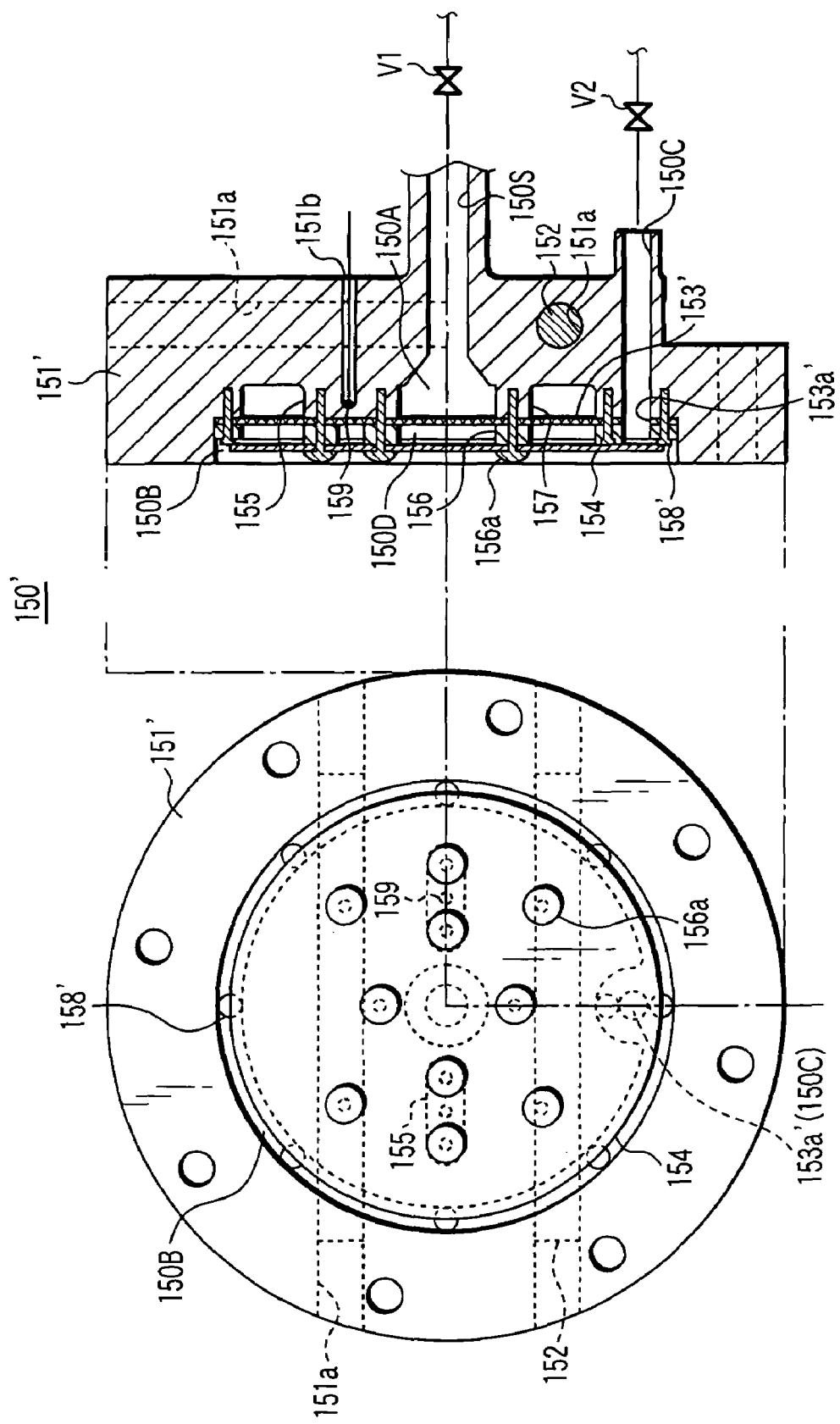
FIGS. 4A and 4B are a schematic inner side view and a schematic sectional side view, respectively, showing the main structure of a vaporizer according to a third embodiment of the present invention.

FIGS. 4A and 4B are a schematic inner side view and a schematic sectional side view, respectively, showing the main structure of a vaporizer according to a third embodiment of the present invention. FIGS. 4A and 4B show a delivery part 150' usable in place of the delivery part 130 of the vaporizer shown in FIG. 1. The other portions of the third embodiment are the same as those of the first embodiment. Portions of the delivery part 150' the same as those of the second embodiment are denoted by the same reference numerals.

In this embodiment, the sidewall 151' is provided with an exhaust passage 150C separately from a delivery passage 150S. The delivery passage 150S is formed to make an internal space 150A communicate with a feed line connected to a reaction processing apparatus, while the exhaust passage 150C is formed to make the internal space 150A communicate with the outside (for example, the exhaust line of the reaction processing apparatus). This exhaust passage 150C is disposed at a position most remote from the spray nozzle, e.g., at the lowest position in FIGS. 4A and 4B. The exhaust passage 150C is connected to an exhaust line, such as a bypass line (evacuation line) bypassing the reaction processing section of the reaction processing apparatus described later, to exhaust gas. The exhaust passage 150C is used for a gas material not to be supplied into the reaction processing section but to be exhausted, until the supply conditions of the gas material are stabilized.

In this embodiment, a filter member 153' has an opening 153a' at a position facing the exhaust passage 150C. The rim of the opening 153a' is formed as part of the peripheral portion of the filter member 153', so that it is connected to the exhaust passage 150C without a gap by setscrews 158' for fixing the filter member 153'.

In this embodiment, the gas material flows around the shield plate 154 into the internal space 150A through a communication clearance 150B. Then, the gas is directly exhausted through the opening 153a' and exhaust passage 150C, when a valve V2 provided on an exhaust line connected to the exhaust passage 150C is opened. At this time, a valve V1 provided on a feed line connected to the delivery passage 150S is closed. Accordingly, the gas material does not pass through the filter member 153' when it is not supplied to the reaction processing section, so the service life of the filter member 153' is prolonged.

When the gas material is supplied into the feed line, the valve V2 provided on the exhaust line connected to the exhaust passage 150C is closed, while the valve V1 provided on the feed line is opened. Consequently, the gas material having been directed to the exhaust passage 150C is switched to flow through the filter member 153' into the delivery passage 150S and feed line.

FOURTH EMBODIMENT

FIGS. 5A and 5B are a schematic inner side view and a schematic sectional side view, respectively, showing the main structure of a vaporizer according to a fourth embodiment of the present invention. FIGS. 5A and 5B show a delivery part 150" usable in place of the delivery part 130 of the vaporizer shown in FIG. 1. The other portions of the fourth embodiment are the same as those of the first embodiment. Portions of the delivery part 150" the same as those of the second embodiment are denoted by the same reference numerals.

In this embodiment, heating means 152" is embedded in a sidewall 151" (in reception holes 151a") such that the distal end thereof is in contact with each of heat transfer portions 157". The heat transfer portions 157" protrude within the internal space 150A and come into thermal contact with a filter member 153 and a shield plate 154, as in the previous embodiments. The heating means 152" comprises, e.g., rod-like heaters directly connected to the heat transfer portions 157", so that the filter member 153 and shield plate 154 can be efficiently heated through the heat transfer portions 157".

Also in this embodiment, heat transfer portions 155" each having an elongated shape in the plan view are disposed as in the embodiments described above. The heat transfer portions 157" extend from the sidewall 151" into some of the heat transfer portions 155" and protrude within the internal space 150A. Specifically, each of the heat transfer portions 155" is disposed to include a heat transfer portions 157".

In this embodiment, the heat transfer portions 157" are respectively provided with threaded holes at their distal ends. The filter member 153, spacers 156, and shield plate 154 are stacked in this order at the distal ends of the heat transfer portions 157". In this state, setscrews 156a are screwed into the threaded holes to fix the filter member 153 and shield plate 154 to the heat transfer portions 157".

FIG. 5C is a view showing a modification of the heating means 152" and a part connected thereto. The heating means 152S" shown in FIG. 5C is formed of a rod-like heater with a screw embedded in the distal end. A nut 152T" to engage with the screw is prepared in place of the spacer 156, and a setscrews 152U" to engage with the nut 152T" is further prepared. The filter member 153 is disposed between the heating means 152S" and a set of nuts 152T", and the shield plate 154 is disposed between the nuts 152T" and a set of setscrews 152U". In this state, the setscrews 152U" are fixed to the heating means 152S" by the nuts 152T".

In this embodiment, the heat transfer portions 157 are formed of part of the heating means 152". With this arrangement, the filter member 153 and shield plate 154 are more efficiently heated. Consequently, the temperature decrease of the shield plate 154 is suppressed. In this case, the set temperature of the heating means 152" is preferably set to be the same as the set temperature of the vaporizing chamber.

FIFTH EMBODIMENT

FIGS. 6A and 6B are a schematic inner side view and a schematic sectional side view, respectively, showing the main structure of a vaporizer according to a fifth embodiment of the present invention. FIGS. 6A and 6B show a delivery part 160 usable in place of the delivery part 130 of the vaporizer shown in FIG. 1. The other portions of the fifth embodiment are the same as those of the first embodiment.

The delivery part 160 includes a sidewall 161 and heating means 162 embedded in the sidewall 161 (in reception holes 161a). A shield plate 164 is closely fixed to the sidewall 161 from inside (from the side facing the vaporizing chamber). An internal space 160A is defined between the sidewall 161 and shield plate 164 and communicates with a delivery passage 160S. The peripheral portion of a filter member 163 is fixed by setscrews 168 or the like within the internal space 160A. At positions other than the peripheral portion, the filter member 163 is in thermal contact with a plurality of heat transfer portions 165 and 167, which protrude from the inner surface of the sidewall 161. The filter member 163 and shield plate 164 are disposed with spacers 166 interposed therebetween, and fixed to the heat transfer portions 165 and 167 by setscrews 166a. An inter-space 160D is formed between the filter member 163 and shield plate 164 to expand all over the filter member 163. A vaporized gas flows through the space between the filter member 163 and shield plate 164, and passes through the filter 163 into the delivery passage 160S.

Each of the heat transfer portions 165 has an elongated shape in the plan view, and contains therein the temperature detection point of a temperature sensor 169, as in some of the embodiments described above.

The shield plate 164 is provided with a plurality of communication openings 164A, which look like slits in the plan view. The communication openings 164A are bent (inflected or curved) in the thickness direction of the shield plate 164 to prevent residual mist entering from the vaporizing chamber from directly reaching the filter member 163. In other words, the communication openings 164A are configured such that, where imaginary straight lines extend from the vaporizing chamber to the communication openings 164A, no imaginary straight lines can directly reach the filter member 163. With this arrangement, essentially all residual mist comes into contact with the shield plate 164 at least once, and then enters the internal space 160A. Consequently, it is possible to promote the effect of vaporizing the residual mist by the shield plate while ensuring flow of the gas material, so as to prevent the filter member 163 from being clogged and suffering concentration of deposit. A plurality of communication openings 164A may be arrayed in parallel or concentrically with each other in the plane of the shield plate 164.

As described above, the shield plate is provided with the communication openings. The communication openings are only required to allow no imaginary straight lines to directly reach the filter member from the vaporizing chamber through the communication openings. Accordingly, in place of the bent shape described above, the communication openings may be through holes formed in the shield plate to be oriented not in directions toward the filter member but in directions deviating from the filter member, to attain the same effect described above.

SIXTH EMBODIMENT

FIGS. 7A and 7B are a schematic inner side view and a schematic sectional side view, respectively, showing the main structure of a vaporizer according to a sixth embodiment of the present invention. FIGS. 7A and 7B show a delivery part 160' usable in place of the delivery part 130 of the vaporizer shown in FIG. 1. The other portions of the sixth embodiment are the same as those of the first embodiment. Portions of the delivery part 160' the same as those of the fifth embodiment are denoted by the same reference numerals.

This embodiment includes a shield plate 164' with communication openings 164A' formed therein. The communication openings 164A' are formed at positions outside the region overlapping a filter member 163 in the plan view, i.e., around the filter member 163. With this arrangement, where imaginary straight lines extend from the vaporizing chamber to the communication openings 164A', no imaginary straight lines can directly reach the filter member 163. In the example shown in the figure, the communication openings 164A' are arc slits. A plurality of communication openings 164A' may be arrayed concentrically at regular intervals. Alternatively, a plurality of communication openings 164A' may be arrayed in a staggered pattern (alternate pattern). As in the previous embodiment, heating means 162 is controlled on the basis of the output of a temperature sensor 169 to control the temperature of the shield plate 164'.

In this embodiment, heating means 164H' formed of, e.g., a wire heater is inserted in the shield plate 164' to directly heat the shield plate 164'. The heating means 164H' extends in the shield plate 164' in a meandering shape. In the example shown in the figure, the heating means 164H' is introduced into the shield plate 164' from outside, but the heating means 164H' may be embedded in the shield plate 164'. Alternatively, the heating means 164H' may be formed of linear parts disposed in a lattice or spiral shape. Further, the heating means 164H' may be formed of a plurality of parts inserted into the shield plate 164'.

The shield plate 164' is also provided with the temperature detection point of a temperature sensor 164TC' therein. The heating means 164H' is controlled by a temperature control circuit CONT, on the basis of temperature detected by the temperature sensor 164TC', to directly and independently control the temperature of the shield plate 164'. With this arrangement, the temperature of the shield plate 164' can be precisely adjusted to an optimum temperature, so as to stabilize vaporization of mist by the shield plate 164'. In this case, the set temperature of the heating means 164H' is preferably set to be the same as the set temperature of the vaporizing chamber.

As described above, heating means is disposed in the shield plate, so as to improve controllability of the temperature of the shield plate. Consequently, the source material can be vaporized more efficiently, and the residual mist and particles can be reduced.

SEVENTH EMBODIMENT

Figures 8A, 8B:
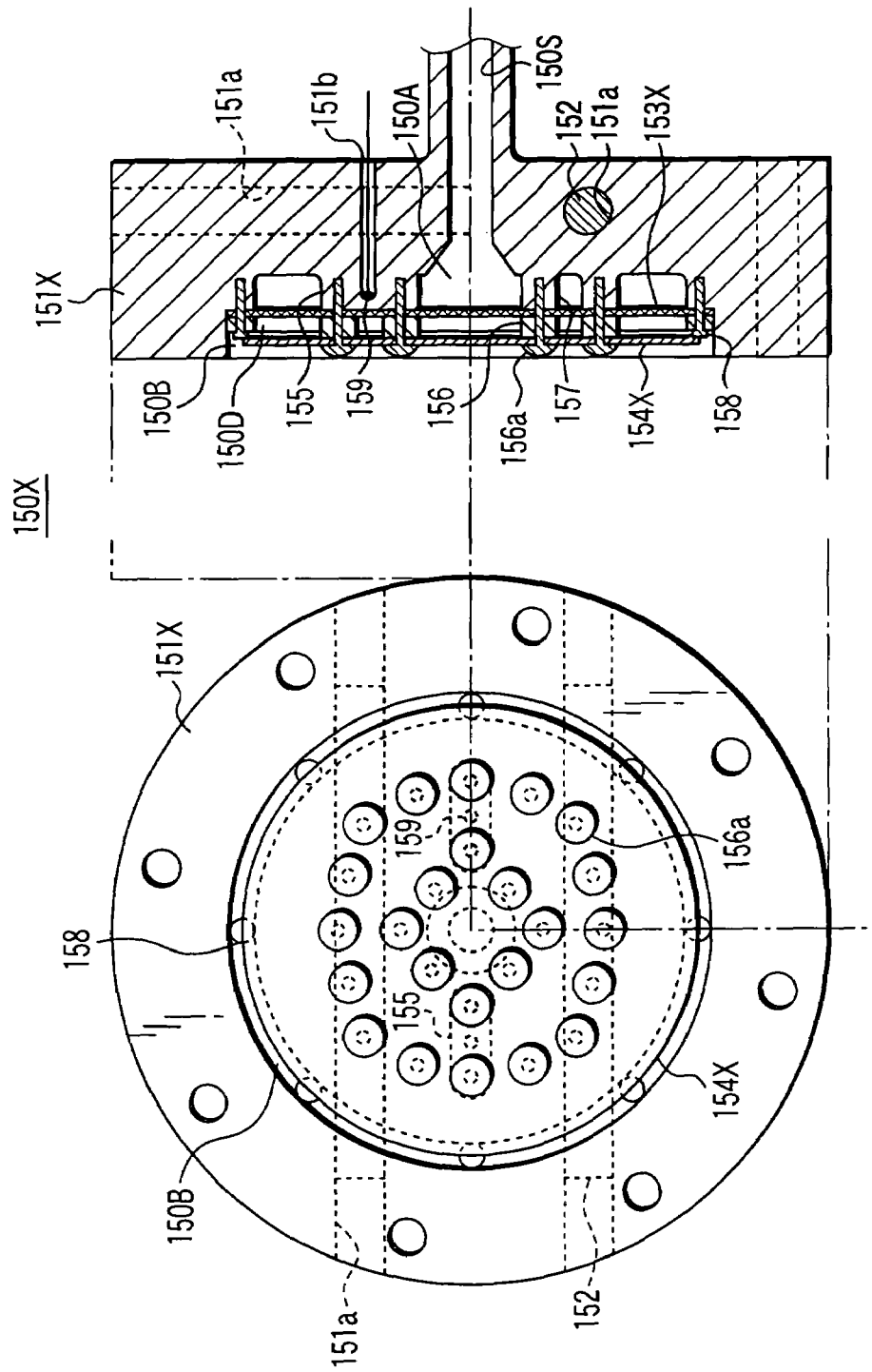
FIGS. 8A and 8B are a schematic inner side view and a schematic sectional side view, respectively, showing the main structure of a vaporizer according to a seventh embodiment of the present invention.

FIGS. 8A and 8B are a schematic inner side view and a schematic sectional side view, respectively, showing the main structure of a vaporizer according to a seventh embodiment of the present invention. FIGS. 8A and 8B show a delivery part 150X usable in place of the delivery part 130 of the vaporizer shown in FIG. 1. The other portions of the seventh embodiment are the same as those of the first embodiment. Portions of the delivery part 150X the same as those of the second embodiment are denoted by the same reference numerals.

This embodiment has the same basic structure as that of the second embodiment, but differs in that the number of heat transfer columns is larger. The heat transfer columns are formed of heat transfer portions 155 and 157, spacers 156, and setscrews 156a, as in the second embodiment, and distributed within an internal space 150A. The heat transfer columns are in thermal contact with a filter member 153X and a shield plate 154X, as in the second embodiment. Further, the heat transfer columns are in thermal contact with the inner surface of a sidewall 151X along with the shield plate 154X.

In this embodiment, a larger number of heat transfer columns are distributed on the delivery part, so residual mist flowing with the gas material from the vaporizing chamber through a communication clearance 150B can more easily come into contact with the heat transfer columns. The residual mist is heated by the heat transfer columns and vaporized into gas, and thus the vaporization efficiency is improved.

EIGHTH EMBODIMENT

FIGS. 9A and 9B are a schematic inner side view and a schematic sectional side view, respectively, showing the main structure of a vaporizer according to an eighth embodiment of the present invention. FIGS. 9A and 9B show a delivery part 150Y usable in place of the delivery part 130 of the vaporizer shown in FIG. 1. The other portions of the eighth embodiment are the same as those of the first embodiment. Portions of the delivery part 150Y the same as those of the second embodiment are denoted by the same reference numerals.

In this embodiment, a plurality of columnar heat transfer portions 157Y are formed on a sidewall 151Y, and a shield plate 154Y is fixed to the heat transfer portions 157Y by setscrews 156a. In this embodiment, no filter member is disposed, but, in place thereof, a number of heat transfer columns formed of the heat transfer portions 157Y are distributed between the inner surface of the sidewall 151Y and the shield plate 154Y. In this case, the heat transfer columns serve as a filter to trap and re-vaporize residual mist and particles entering from a communication clearance 150B into an internal space 150A.

Specifically, the shield plate 154Y is disposed to cover a delivery port (gas outlet) 150SO connected to a delivery passage 150S, and a gas passage (to further vaporize the source material) is formed between the shield plate 154Y and delivery passage 150S and connects the vaporizing chamber 110 (see FIG. 1) to the delivery port 150SO. In this gas passage, the heat transfer columns or heat transfer portions 157Y serve as a fluid baffle alternative to a filter member. If necessary a filter member may be further added to this structure.

Also in this embodiment, the heat transfer portions 157Y are arrayed to prevent residual mist entering through the communication clearance 150B from directly flowing out of the delivery passage 150S. Specifically, the heat transfer portions 157Y are configured such that, where imaginary straight lines extend from the communication clearance 150B into the internal space 150A, all of them can reach the heat transfer portions 157Y. Particularly, a plurality of heat transfer portions 157Y are arrayed in a direction essentially perpendicular to the flow direction of a source material gas, so that no imaginary straight lines can extend, without passing through the heat transfer portions 157Y, from the periphery of the internal space 150A near the communication clearance 150B to the inner annular surface of the delivery passage 150S. For example, the heat transfer portions 157Y are arrayed in a staggered pattern.

NINTH EMBODIMENT

FIGS. 10A and 10B are a schematic inner side view and a schematic sectional side view, respectively, showing the main structure of a vaporizer according to a ninth embodiment of the present invention. FIGS. 10A and 10B show a delivery part 150Z usable in place of the delivery part 130 of the vaporizer shown in FIG. 1. The other portions of the ninth embodiment are the same as those of the first embodiment. Portions of the delivery part 150Z the same as those of the second embodiment are denoted by the same reference numerals.

In this embodiment, a heat transfer frame 157Z is attached and fixed to a sidewall 151Z from inside (from the side facing the vaporizing chamber). The heat transfer frame 157Z has an outer frame portion directly in thermal contact with the sidewall 151Z and a plurality of beam portions 157Za extending inward from the outer frame portion. A filter member 153Z is fixed at the peripheral portion to the outer frame portion. The filter member 153Z is in thermal contact with the beam portions 157Za at positions other than the peripheral portion. A shield plate 154Z is fixed via spacers 156 to the filter member 153Z by setscrews 156a. In this embodiment, the filter member 153Z and shield plate 154Z are connected to each other by the beam portions 157Za, spacers 156, and setscrews 156a, at positions other than the peripheral portion.

The inner surface of the sidewall 151Z and the beam portions 157Za face each other with a gap interposed therebetween. With this arrangement, after a gas material flows through the communication clearance 150B into the internal space 150A, and passes through the filter member 153Z, it is delivered into a feed line without being interfered with the beam portions 157Za.

Heating means 157H is inserted in the heat transfer frame 157Z at the beam portions 157Za. In the example shown in the figure, the wire heating means 157H extends in a meandering shape to pass through a plurality of beam portions 157Za in order. As a matter of course, the heating means 157H may be formed of a plurality of parts inserted into the respective beam portions 157Za or embedded in the respective beam portions 157Za.

The temperature detection point of a temperature sensor 157TC is disposed in the heat transfer frame 157Z, particularly in the beam portions 157Za. The heating amount of the heating means 157H is controlled by a temperature control circuit CONT, on the basis of temperature detected by the temperature sensor 157TC. With this arrangement, the temperature of the heat transfer frame 157Z can be adjusted independently of the sidewall 151Z. As described above, the temperature of the heat transfer portions 157Za is detected by the temperature sensor 157TC to control the heating means 157H. Accordingly, the temperature controllability of the shield plate 154Z is improved, and the temperature of the shield plate 154Z is less decreased. In this case, the set temperature of the heating means 157H is preferably set to be the same as the set temperature of the vaporizing chamber.

In this embodiment, each of the beam portions 157Za may be formed of heating means, such a rod-like heater, as a whole. Heating means may be disposed in the outer frame portion of the heat transfer frame 157.

As described above, the heat transfer portions may be formed of beams, the heat transfer portions may be provided with heating means therein, or the heat transfer portions may be formed of heating means as a whole.

TENTH EMBODIMENT

FIGS. 11A and 11B are a schematic inner side view and a schematic sectional side view, respectively, showing the main structure of a vaporizer according to a tenth embodiment of the present invention. FIGS. 11A and 11B show a delivery part 170 usable in place of the delivery part 130 of the vaporizer shown in FIG. 1. The other portions of the tenth embodiment are the same as those of the first embodiment.

This delivery part 170 has a structure in which a plate member 172 having a heating function is fitted in a sidewall 171 from inside. The plate member 172 has an inner end surface 172a facing the vaporizing chamber, and thereby provides the same function as the shield plate described above. The inner end surface 172a is separated from the sidewall 171 around it with a gap that serves as a communication clearance 170B. On the reverse side from the inner end surface 172a, the plate member 172 includes a plurality of columnar heat transfer portions 172p facing the sidewall 171. The heat transfer portions 172p are in thermal contact with the inner surface of the sidewall 171.

A heating portion 172H, such as a heater, and a temperature detecting portion, such as a temperature sensor 172TC, are embedded in the plate member 172. A part of the plate member 172 protrudes outside through the sidewall 171, at which electric feed terminals 172e connected to the heating portion 172H and a detection terminal 172f of the temperature sensor 172TC are disposed. The delivery part 170 has an internal space 170A defined by a region surrounded by the sidewall 171 and plate member, and connected to a delivery passage 170S. The internal space 170A has an annular shape (like a ring).

A number of heat transfer portions 172p are distributed in the internal space 170A to be perpendicular to the flow direction of a source material gas. The heat transfer portions 172p serve as a filter to trap residual mist and particles entering from the vaporizing chamber. The heat transfer portions 172p, i.e., heat transfer columns, are in thermal contact with the inner surface of the sidewall 171 as well as the portion defining the inner end surface 172a of the plate member 172, which provides the same function as the shield plate. With this arrangement, residual mist comes into contact with the heat transfer portions 172p and vaporized, so the vaporization efficiency is improved and generation of particles is suppressed. An annular filter member may be disposed in the internal space 170A, so as to remove residual mist and solid substances, such as particles.

The surface of the plate member 172 facing the vaporizing chamber 110 (see FIG. 1) serves as a vaporizing surface for vaporizing the liquid material as the other inner surface of the vaporizing chamber 110 does. Further, the plate member 172 covers a delivery port (gas outlet) 170SO connected to the delivery passage 170S, such that a gas passage is formed between the plate member 172 and delivery passage 170S to allow the vaporizing chamber 110 and delivery port 170SO to communicate with each other. In this gas passage, the heat transfer columns or heat transfer portions 172p serves as a fluid baffle alternative to a filter member.

Also in this embodiment, the heat transfer portions 172p are configured such that, where imaginary straight lines extend from the vaporizing chamber through the communication clearance 170B, no imaginary straight lines can directly reach the delivery passage 170S without passing through the heat transfer portions 172p. Particularly, a plurality of heat transfer portions 172p are arrayed such that no imaginary straight lines can extend, without passing through the heat transfer portions 172p, from positions of the internal space 170A (the periphery thereof in FIGS. 11A and 11B) near the communication clearance 170B to the delivery passage 170S (the inner annular surface thereof). With this arrangement, essentially all residual mist comes into contact with the heat transfer portions 172p at least once, and then enters the delivery passage 170S. Consequently, it is possible to promote the effect of vaporizing the residual mist while ensuring flow of the gas material and preventing delivery of particles. Further, since no filter member is used, the vaporizing chamber can be free from pressure increase due to clogging, and can have a long service life.

The temperature control of the plate member 172 is performed by a temperature control circuit CONT, on the basis of temperature detected by the temperature sensor 172TC, independently of the temperature control of the vaporizing chamber. Consequently, the temperature decrease of the inner end surface 172a serving as a shield plate is suppressed. In this case, the set temperature of the plate member 172 is preferably set to be the same as the set temperature of heating means for the vaporizing chamber. Other heating means may be embedded in the sidewall 171.

ELEVENTH EMBODIMENT

FIGS. 12A and 12B are a schematic inner side view and a schematic sectional side view, respectively, showing the main structure of a vaporizer according to an eleventh embodiment of the present invention. FIGS. 12A and 12B show a delivery part 170' usable in place of the delivery part 130 of the vaporizer shown in FIG. 1. The other portions of the eleventh embodiment are the same as those of the first embodiment. Portions of the delivery part 170' the same as those of the tenth embodiment are denoted by the same reference numerals.

This embodiment has a structure in which a plate member 172' is fitted in a sidewall 171' from inside. The plate member 172' has an inner end surface 172a separated from the sidewall 171' around it to form a communication clearance 170B'. An internal space 170A' is defined between the sidewall 171' and plate member 172', and connected to a delivery passage 170S'. The internal space 170A has an annular shape (like a ring).

In this embodiment, an annular filter member 173 is disposed inside the internal space 170A'. The peripheral portion of the filter member 173 is fixed to the inner surface of the sidewall 171'. At positions other than the peripheral portion, the filter member 173 is in thermal contact with columnar heat transfer portions 171p' protruding from the sidewall 171' and columnar heat transfer portions 172p' protruding from the plate member 172'. The filter member 173 is sandwiched between the heat transfer portions 171p' and 172p'.

In this embodiment, other heating means 172" is also embedded in the sidewall 171' (in reception holes 171a'). The filter member 173 is arranged to receive heat from both of the heating portion 172H of the plate member 172' and the heating means 172" through the heat transfer portions 171p' and 172p'. Accordingly, the filter member 173 can receive a large amount of heat through the heat transfer portions. With this arrangement, the vaporization efficiency can be increased, while the filter member removes residual mist and solid substances, such as particles.

TWELFTH EMBODIMENT

Figures 13A, 13B:
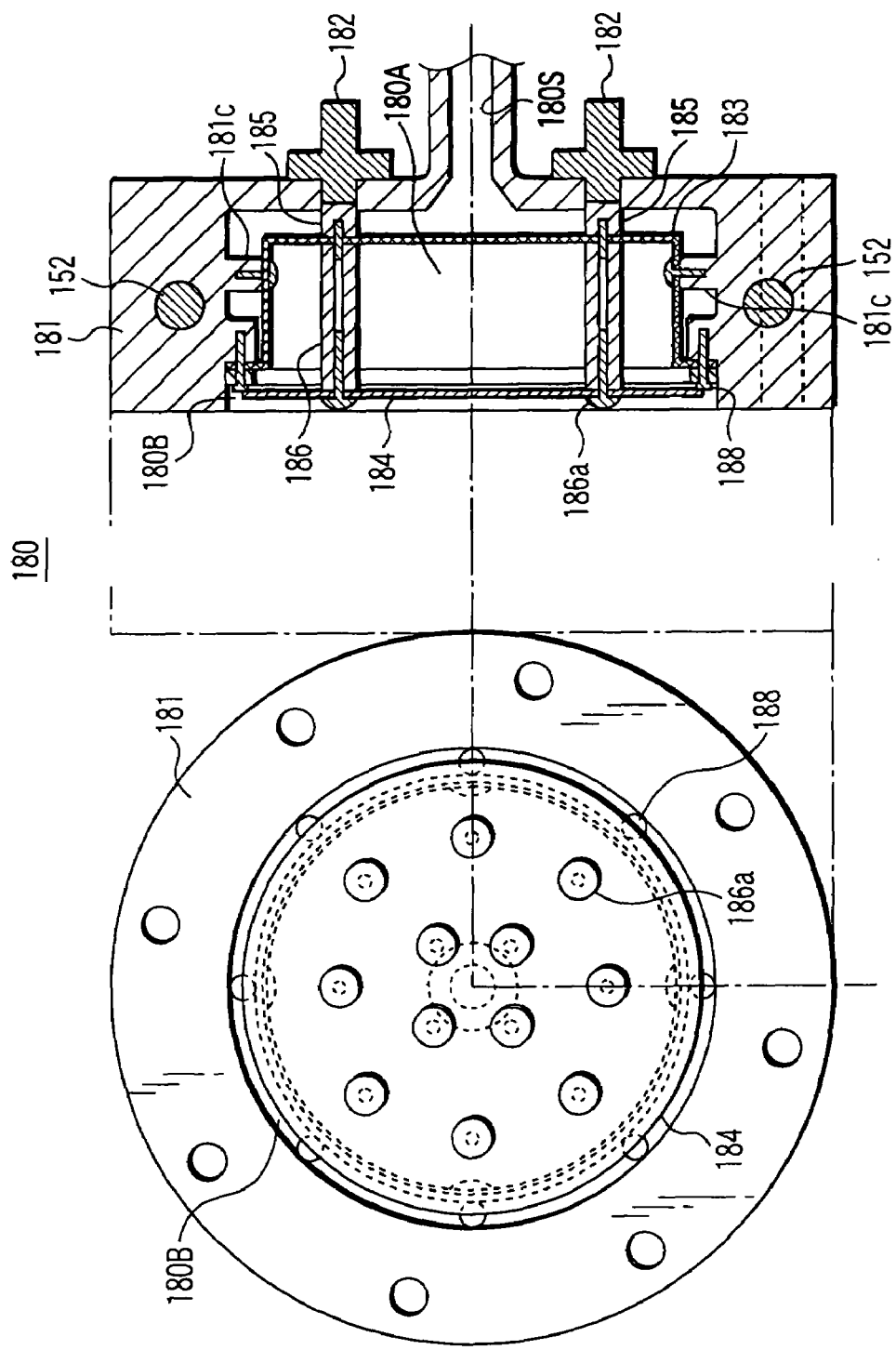
FIGS. 13A and 13B are a schematic inner side view and a schematic sectional side view, respectively, showing the main structure of a vaporizer according to a twelfth embodiment of the present invention.

FIGS. 13A and 13B are a schematic inner side view and a schematic sectional side view, respectively, showing the main structure of a vaporizer according to a twelfth embodiment of the present invention. FIGS. 13A and 13B show a delivery part 180 usable in place of the delivery part 130 of the vaporizer shown in FIG. 1. The other portions of the twelfth embodiment are the same as those of the first embodiment.

In this embodiment, heating means 182 is formed of a plurality of parts inserted into a sidewall 181 from outside, and attached thereto. The distal ends of the heating means 182 are respectively connected to columnar heat transfer portions 185 protruding from the inner surface of the sidewall 181.

An internal space 180A is defined within the sidewall 181 and communicates with a delivery passage 180S. A filter member 183 like a container is disposed inside the internal space 180A and is opened inward (facing the vaporizing chamber). The peripheral portion of the filter member 183 is fixed to the inner surface of the sidewall 181 by setscrews 188 or the like. At positions other than the peripheral portion, the filter member 183 is in thermal contact with columnar support projections 181c protruding from the sidewall 181 and the heat transfer portions 185.

A shield plate 184 is disposed at a position of the internal space 180A facing the vaporizing chamber (inner side from the filter member 183). The shield plate 184 is in thermal contact with the filter member 183 through spacers 186, and is fixed to the heat transfer portions 185 by setscrews 186a.

The shield plate 184 is separated from the sidewall 181 around it with a gap that serves as a communication clearance 180B.

In this embodiment, the filter member 183 has a shape like a container with a depth extending in the axial direction. Consequently, the filter member 183 has a side portion extending in the axial direction, which increases the filtering area, and thereby prolong the service life of the filter member 183. The heat transfer columns or heat transfer portions 185, spacers 186, and setscrews 186a are directly in thermal contact with the heating means 182. Consequently, the filter member 183 and shield plate 184 can be efficiently heated.

THIRTEENTH EMBODIMENT

FIGS. 14A and 14B are a schematic inner side view and a schematic sectional side view, respectively, showing the main structure of a vaporizer according to a thirteenth embodiment of the present invention. FIGS. 14A and 14B show a delivery part 190 usable in place of the delivery part 130 of the vaporizer shown in FIG. 1. The other portions of the thirteenth embodiment are the same as those of the first embodiment.

In this embodiment, heating means 192 is embedded in a sidewall 191 (in reception holes 191a). An internal space 190A opened inward (facing the vaporizing chamber) is formed in the sidewall 191 and communicates with a delivery passage 190S.

A filter member 193 is disposed inside the internal space 190A, and fixed to the sidewall 191 by setscrews 198 or the like at the peripheral portion. At positions other than the peripheral portion, the filter member 193 is in thermal contact with a plurality of columnar heat transfer portions 197, which protrude from the inner surface of the sidewall 191. A shield plate 194 facing the vaporizing chamber is disposed on the inner side of the filter member 193 with spacers 196 interposed therebetween, and is fixed to the heat transfer portions 197 by setscrews 196a. The shield plate 194 is separated from the sidewall 191 around it with a gap that serves as a communication clearance 190B. An inter-space 190D is formed between the shield plate 194 and filter member 193 to expand all over the filter member 193.

The sidewall 191 has a hole 191b formed therein, and a temperature sensor 199 is inserted in the hole 191b. The temperature detection point of the temperature sensor 199 is positioned near or inside one of the heat transfer portions 197.

In this embodiment, heating means 193H is disposed in the filter member 193. Specifically, the heating means 193H is formed of a wire heater, which extends through the filter member 193 in a meandering shape. A temperature sensor 193TC is also disposed in the filter member 193. The heating amount of the heating means 197H is controlled by a temperature control circuit CONT, on the basis of temperature detected by the temperature sensor 193TC, so that the temperature of the filter member 193 is directly and independently controlled.

In this embodiment, the heating means 193H is disposed in the filter member 193, so that the filter member 193 is directly heated and the temperature of the filter member 193 is directly and independently controlled. With this arrangement, the temperature of the filter member 193 can be precisely controlled, and the uniformity in the temperature can be improved. Consequently, the filter member 193 is prevented from being clogged and suffering local concentration of deposit, the pressure increase inside the vaporizing chamber is suppressed, and the service life of the filter is prolonged.

FOURTEENTH EMBODIMENT

Figure 15:
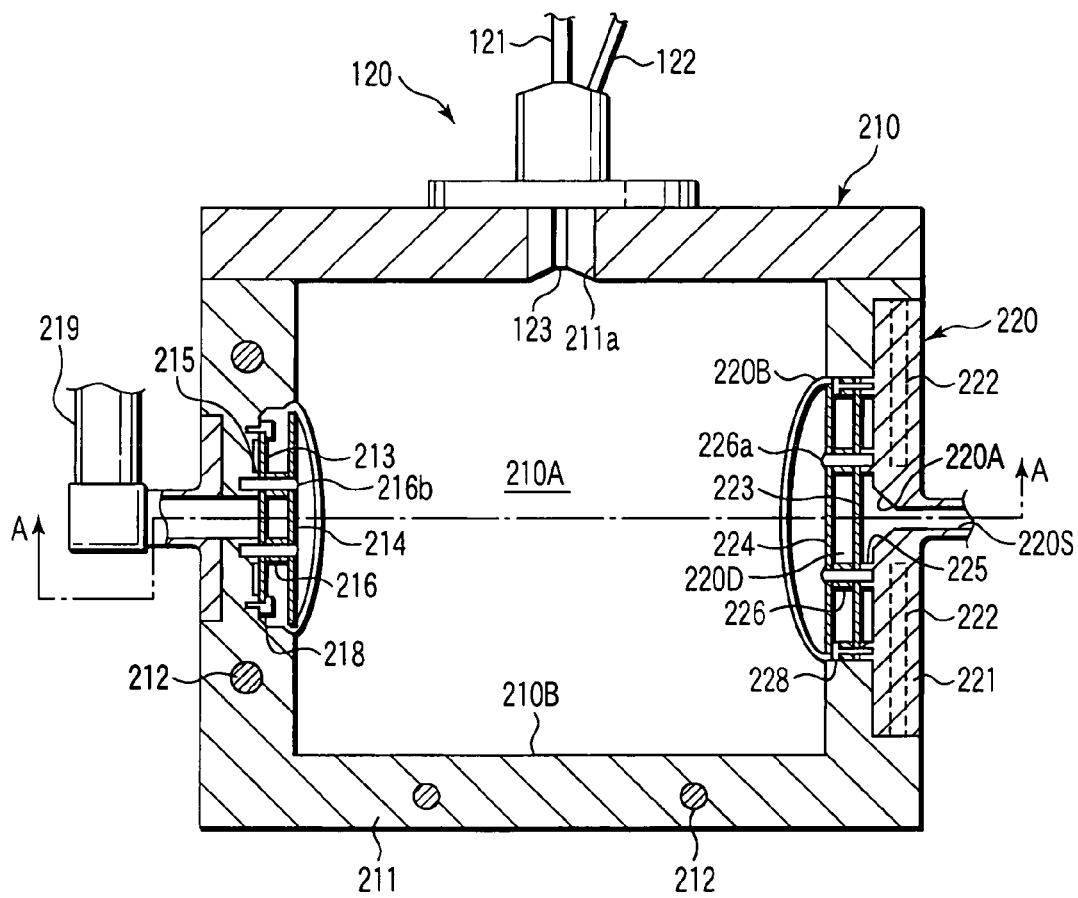
FIG. 15 is a schematic sectional side view showing a vaporizer according to a fourteenth embodiment of the present invention.
Figure 16:
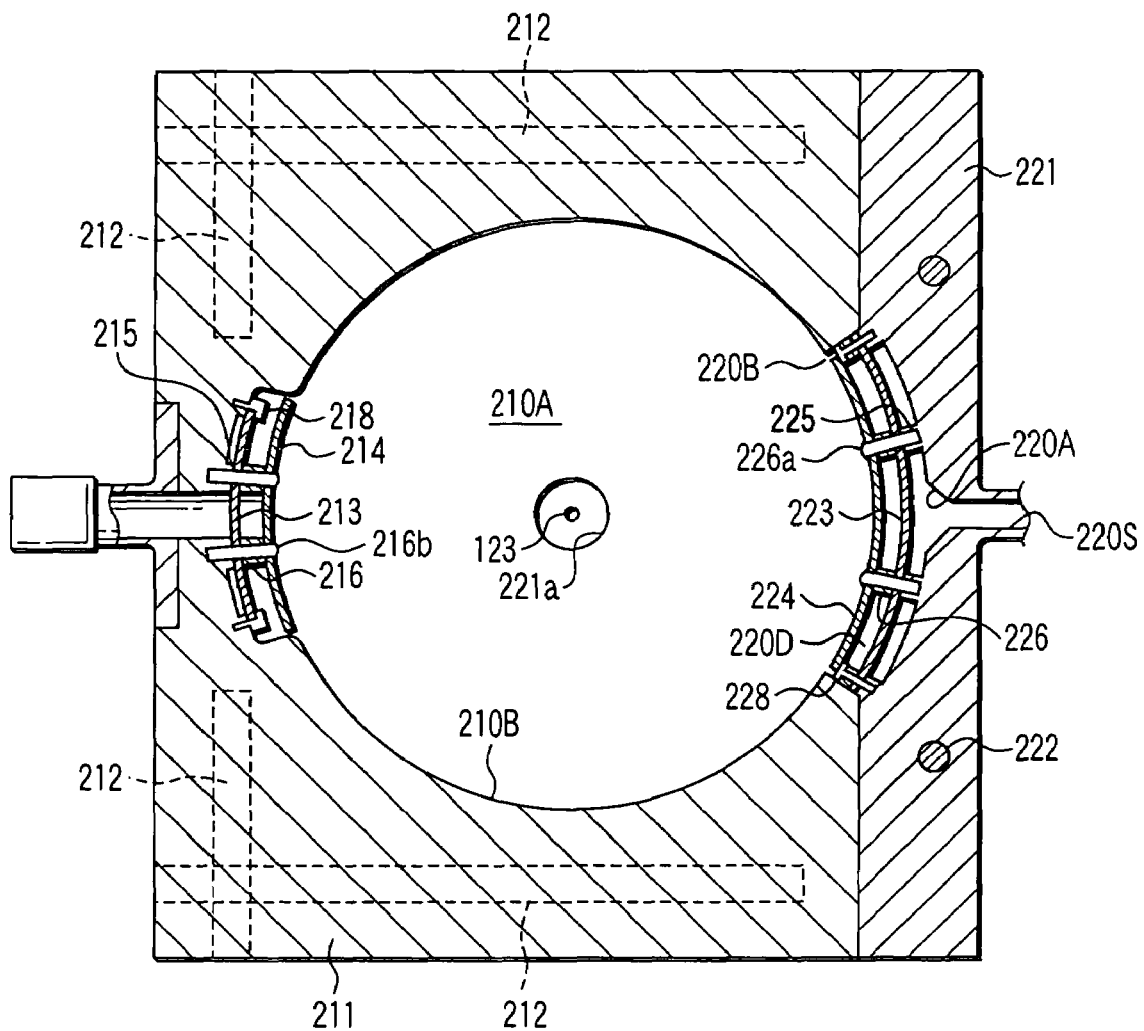
FIG. 16 is a sectional plan view showing the vaporizer according to the fourteenth embodiment, taken along the line A-A in FIG. 15.

FIG. 15 is a schematic sectional side view showing a vaporizer according to a fourteenth embodiment of the present invention. FIG. 16 is a sectional plan view showing the vaporizer according to the fourteenth embodiment, taken along the line A-A in FIG. 15. The vaporizer according to this embodiment has a vaporizing chamber 210 forming a vaporizing surface 210B and a vaporizing space 210A, as in the first embodiment. A spray means 120 is disposed to spray a liquid material within the vaporizing space 210A. A delivery part 220 serving as a second vaporizing region is detachably attached to the vaporizing chamber 210. The structure of the spray means 120 (a source material supply pipe 121, a spray gas supply pipe 122, and a spray nozzle 123), the sidewall 211, and heating means 212 of the vaporizing chamber 210 are the same as those of the first embodiment. The delivery part 220 includes a sidewall 221, heating means 222, a filter member 223, a shield plate 224, heat transfer portions 225, spacers 226, and setscrews 226*a*, which have the same functions as those of the first embodiment. An internal space 220A formed in the delivery part 220, a communication clearance 220B formed around the shield plate 224, and a delivery passage 220S are arranged in the same manners as those of the first embodiment.

As shown in FIG. 16, in this embodiment, the vaporizing chamber 210 has an inner surface shape which is curved about the axial line of the spray nozzle 123. Specifically, the vaporizing chamber 210 is cylindrical. The vaporizing chamber 210 may be conical about the axial line of the spray nozzle 123, or spherical with a diameter corresponding to the axial line of the spray nozzle 123. The filter member 223 and shield plate 224 have a curved shape extending along the inner surface that is curved about the axial line of the spray nozzle 123, as described above. The peripheral portion of the filter member 223 is fixed to the sidewall 221 by setscrews 228 or the like. An inter-space 220D is formed between the filter member 223 and shield plate 224.

As described above, in this embodiment, the shield plate 224 has a shape extending along the inner surface of the vaporizing chamber 210. Consequently, a large filtering area is ensured, and the vaporizer is compact. Further, in this embodiment, the delivery part 220 is configured to hardly affect flows of the mist and gas material within the vaporizing chamber 210. Specifically, in the example shown in the figure, the vaporizing chamber 210 has a shape (a revolution body shape) that essentially uniformly extends all around the axial line of the spray nozzle 123. With this arrangement, the temperature distribution within the vaporizing chamber 210, and the temperature distribution on the inner surface of the vaporizing surface 210B and shield plate 224 can be stable. Consequently, solid substances are prevented from being intensively deposited on a specific portion. The filter member 223 has a planar shape extending along the shield plate 224, so the distance between the filter member 223 and shield plate 224 is constant. In this case, it is possible to effectively use the entirety of the filter member 223, so as to efficiently trap residual mist and solid substances.

In this embodiment, as described above, the vaporizing chamber 210 has an inner surface curved about the axial line of the spray nozzle 123, but the shape of the vaporizing chamber is not limited to a specific one. The vaporizing chamber may have a polyhedral shape, such as a cubic (hexahedral) shape. In this case, the shield plate and/or filter member are preferably formed to have a shape defined by part of a polyhedral shape, which extends along the inner surface of the vaporizing chamber, as described above. In this case, the shield plate and/or filter member may form two or more sides of the polyhedral shape. Further, the vaporizing chamber may have an inner surface formed of a combination of a curved surface and a flat surface.

In this embodiment, as in the first embodiment, a port connected to a detection pipe 219 for attaching a pressure gauge (not shown) is formed to face the vaporizing chamber 210A. This port is provided with a filter member 213 and a shield plate 214 disposed on the side of the filter member 213 facing the vaporizing chamber 210A. The filter member 213 is in contact with heat transfer portions 215 protruding from the inner surface of the sidewall 211. The shield plate 214 is fixed to the heat transfer portions 215 by setscrews 216*a* with spacers 216 interposed therebetween, and is in thermal contact with the heat transfer portions 215 through the spacers 216 and setscrews 216*a*. A clearance is formed between the shield plate 214 and sidewall 211 to allow the vaporizing chamber 210A to communicate with a space containing the filter member 213. Further, this clearance communicates with the inside of the detection pipe 219 through the filter member 213.

The shield plate 214 prevents residual mist and solid substances entering from the vaporizing chamber 210A from easily reaching the filter member 213. Consequently, the filter member 213 can be less clogged, and the service life of the filter member 213 is thereby prolonged. At positions other than the peripheral portion, the filter member 213 and shield plate 214 are in thermal contact with the sidewall 211 through the heat transfer portions 215. These members are heated as in the inner surface of the vaporizing chamber 210A, and residual mist deposited thereon is thereby vaporized.

FIFTEENTH EMBODIMENT

Figure 17A:
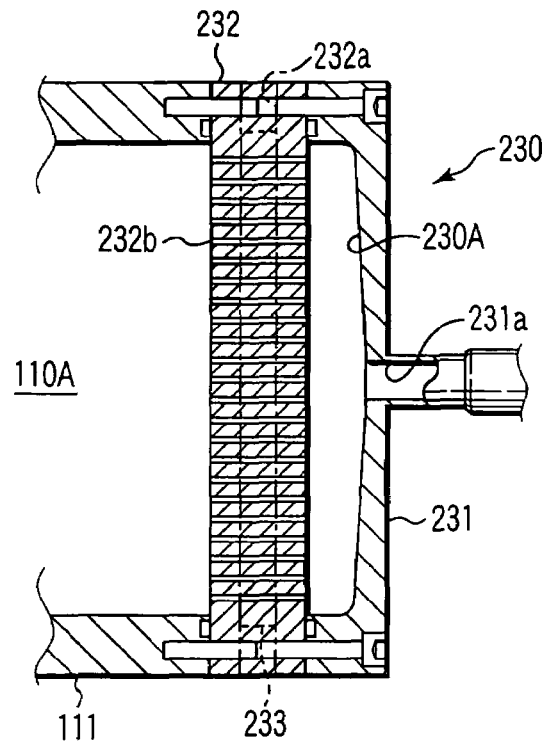
FIGS. 17A and 17B are schematic sectional side views showing vaporizers according to a fifteenth embodiment and a sixteenth embodiment of the present invention, respectively.

FIG. 17A is a schematic sectional side view showing a vaporizer according to a fifteenth embodiment of the present invention. The portions of the fifteenth embodiment other than a delivery part 230 are the same as those of the first embodiment. The delivery part 230 includes a sidewall 231, a honeycomb filter member 232 disposed between the sidewall 231 and vaporizing space 110A, and heating means 233, such as a heater embedded in the filter member 232. A gas material delivery passage 231*a* is connected to the sidewall 231 to deliver a gas material into a feed line. Heating means for heating the sidewall 231 may be separately disposed to prevent a gas having passed through the filter member 232 from decreasing the temperature. This heating means may be disposed inside the sidewall 231 or on the outer surface thereof.

The filter member 232 is a plate made of a metal having a good thermal conductivity (for example, stainless steel), or a ceramic, such as AlN or SiC. The filter member 232 has a reception through hole (or reception hole, hereinafter) 232*a* formed therein and extending in a direction across ("perpendicular to" in the example shown in the figure) the flow direction of the gas material (in the direction toward right in the figure). The heating means 233 is inserted in the reception hole 232*a*. The heating means 233 may be configured to be present over the entirety inside the filter member 232. In this case, the thermal efficiency is further improved. The filter member 232 further has a number of fine holes 232b penetrating therethrough in a direction essentially parallel with the flow direction of the gas material. The fine holes 232b may be formed essentially perpendicular to the flow direction of the gas material, so that residual mist and solid substances come into contact with the filter member and are re-vaporized thereon.

The fine holes 232b have a shape with a penetration distance (length) larger than the diameter. The length of the fine holes 232b (which is the same as the thickness of the filter member 232 in the example shown in the figure) is designed to sufficiently increase the trapping rate of fine residual mist generated in the vaporizing space 110A. Specifically, the fine holes 232b have a diameter of about 0.01 to 1.0 mm, and a penetration distance of about 5 to 15 mm.

Some of the fine holes 232b may be directed across the reception hole 232a for the heating means 233. Alternatively, part of the fine holes 232b may be omitted at the position intersecting with the reception hole 232a.

SIXTEENTH EMBODIMENT

Figure 17B:
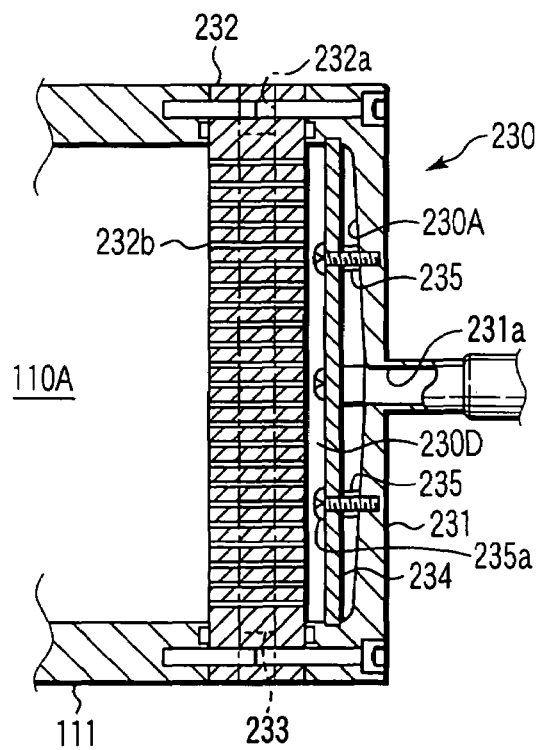

FIG. 17B is a schematic sectional side view showing a vaporizer according to a sixteenth embodiment of the present invention. In the sixteenth embodiment, a filter member 234 is disposed between a sidewall 231 and a honeycomb filter member 232. The filter member 234 is connected and fixed to the sidewall 231 by fixing members 235. An inter-space 230D is formed between the filter member 232 and filter member 234 to expand all over these filters. The portions of the sixteenth embodiment other than the filter member 232 and heating means 233 are the same as those of the fifteenth embodiment shown in FIG. 17A.

In this structure, the filter member 234 disposed downstream from the honeycomb filter member 232 provides the effect of further reducing mist and particles delivered to a feed line. The filter member 234 is preferably configured to trap finer residual mist than the filter member 232 does. For example, the filter member 234 may be the same as the filter member 133 of the first embodiment. In the example shown in the figure, the filter member 234 is heated through the sidewall 231, or indirectly heated by radiation heat from the filter member 232. The filter member 234 is supplied with heat from heating means through heat transfer portions 235 (spacers), as in the filter member 133 shown in FIG. 1. The filter member 234 is fixed to the heat transfer portions 235 and sidewall 231 by fixing means 235a. Heating means may be embedded in the filter member 234, as in the filter member 232 of the fifteenth embodiment. Heating means may be embedded in the sidewall 231. In any case, the filter member 234 is preferably controlled to be heated at the same temperature as the vaporizing surface (inner surface) of the vaporizing chamber.

In this embodiment, the filter member 232 traps and vaporizes relatively large residual mist, while the filter member 234 traps relatively small residual mist. Accordingly, the mist removing rate is improved, and the filter members 232 and 234 can be less clogged.

SEVENTEENTH EMBODIMENT

Figure 18A:
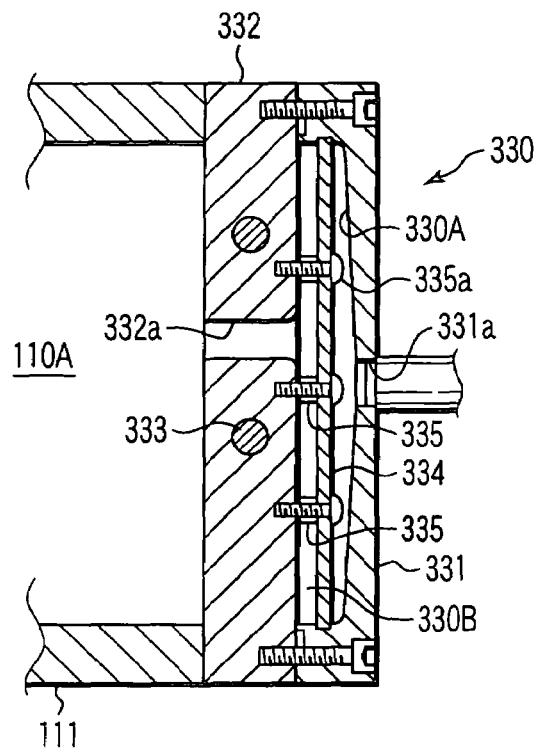
FIGS. 18A and 18B are schematic sectional side views showing vaporizers according to a seventeenth embodiment and an eighteenth embodiment of the present invention, respectively.
Figure 18B:
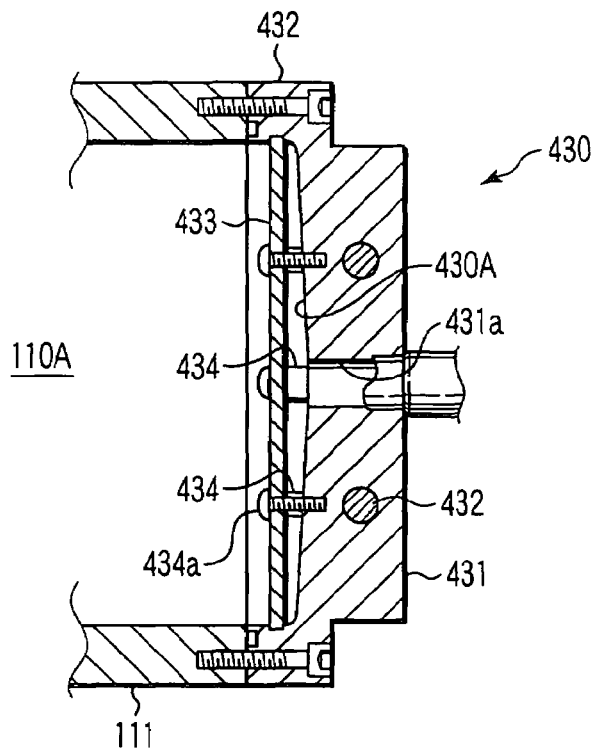

FIG. 18A is a schematic sectional side view showing a vaporizer according to a seventeenth embodiment of the present invention. The portions of the seventeenth embodiment other than a delivery part 330 are the same as those of the first embodiment.

In this embodiment, the delivery part 330 includes an outer wall 331 and an inner wall 332 disposed on the inner side of the outer wall 331 and facing a vaporizing space 110A. The outer wall 331 has a gas material delivery passage 331a connected thereto. The inner wall 332 has a communication hole 332a connecting the vaporizing space 110A to an internal space 330A of the delivery part 330. A heating means 333 such as a heater is embedded in the heating means 333.

The internal space 330A is defined between the outer wall 331 and inner wall 332. A filter member 334 is disposed within the internal space 330A. At positions other than the peripheral portion, the filter member 334 is in thermal contact with the inner wall 332 through heat transfer portions 335. The heat transfer portions 335 are configured to receive heat generated by the heating means 333 from the inner wall 332 and transfer heat to the filter member 334 at positions other than the peripheral portion. The filter member 334 is connected and fixed to the inner wall 332 through the heat transfer portions 335. Specifically, the filter member 334 is fixed to the heat transfer portions 335 and inner wall 332 by fixing means 335a. Thus, the heat transfer portions 335 also serve as support members for supporting the filter member 334.

In this embodiment, the gas material is generated within the vaporizing space 110A and enters the internal space 330A through the communication hole 332a. The gas material in the internal space 330A passes through the filter member 334 and then is delivered from a gas material delivery passage 331a. The filter member 334 is heated by the heating means 333 through the heat transfer portions 335, so, when fine residual mist contained in the gas material is deposited thereon, the mist is reliably vaporized. In the example shown in the figure, at distributed positions other than the peripheral portion, the filter member 334 is in thermal contact with the plurality of heat transfer portions 335. Consequently, the entire filter member 334 is uniformly heated, so that the filter member 334 becomes less uneven in temperature, and is prevented from being locally clogged. Also in this case, the filter member 334 is preferably controlled to be heated at the same temperature as the vaporizing surface (inner surface) of the vaporizing chamber.

In this embodiment, the inner wall 332 of the delivery part 330 faces the vaporizing space 110A of the vaporizing chamber 110. The inner wall 332 is provided with the heating means 333 embedded therein, so the heating means 333 contributes the effect of vaporizing the source material within the vaporizing space 110A.

The communication hole 332a formed in the inner wall 332 is positioned to be closer to the spray means (or spray nozzle (not shown)). With this arrangement, when mist is sprayed within vaporizing space 110A, it is less possible that the mist directly flows through the communication hole 332a and is trapped by the filter member 334.

EIGHTEENTH EMBODIMENT

FIG. 18A is a schematic sectional side view showing a vaporizer according to an eighteenth embodiment of the present invention. This embodiment includes a delivery part 430, in which heating means 432 is embedded in a sidewall 431. A filter member 433 is disposed on the inner side of the sidewall 431. At positions other than the peripheral portion, the filter member 433 is in thermal contact with heat transfer portions 434 (spacers), which protrude from the sidewall 431. The heat transfer portions 434 are connected and fixed to both of the filter member 433 and sidewall 431. Specifically, the filter member 433 is fixed to the heat transfer portions 434 and sidewall 431 by fixing means 434a. Thus, the heat transfer portions 434 also serve as support members for supporting the filter member 433. Also in this case, the filter member 434 is preferably controlled to be heated at the same temperature as the vaporizing surface (inner surface) of the vaporizing chamber.

NINETEENTH EMBODIMENT

Figure 19:
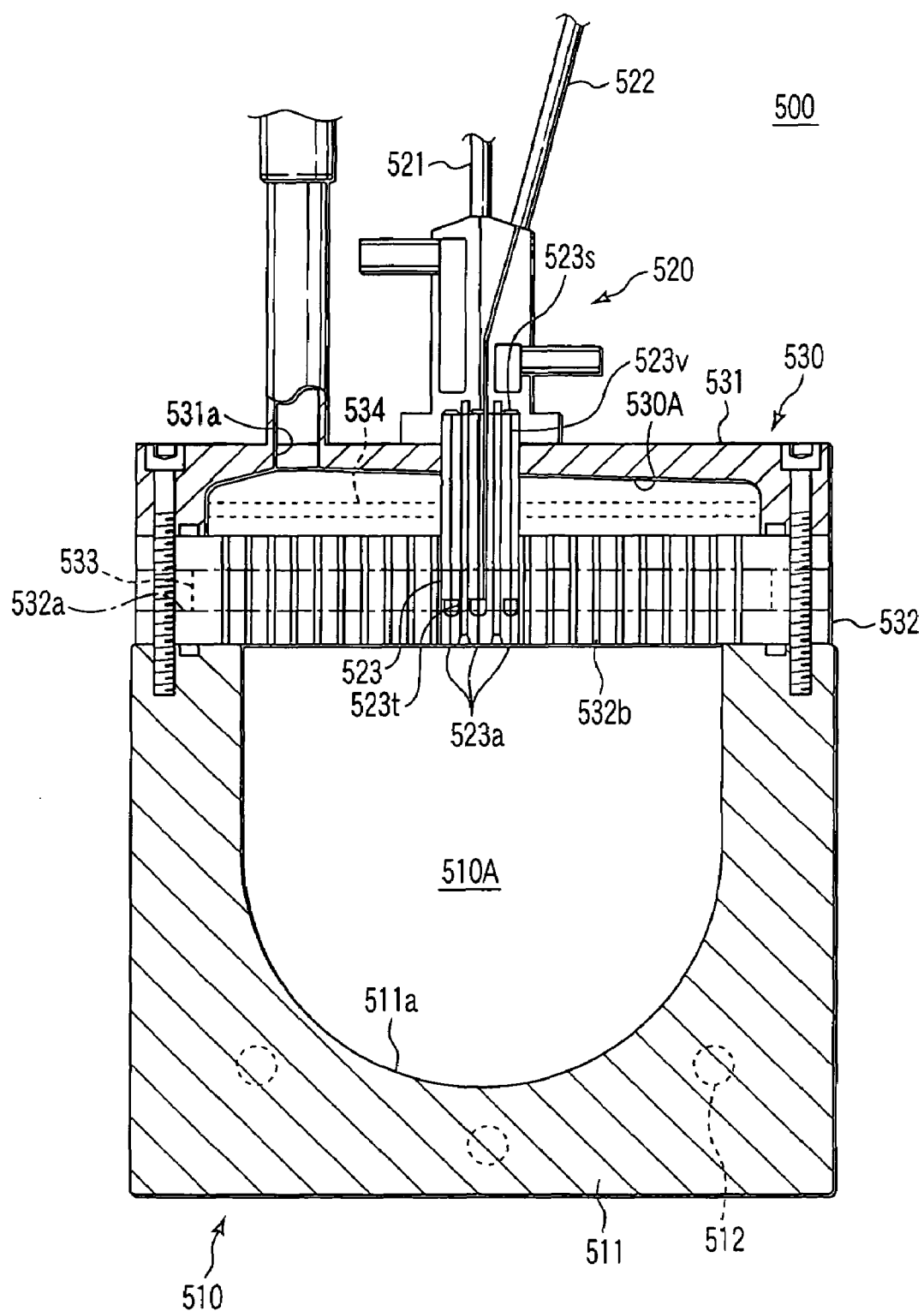
FIG. 19 is a schematic sectional side view showing a vaporizer according to a nineteenth embodiment of the present invention.

FIG. 19 is a schematic sectional side view showing a vaporizer according to a nineteenth embodiment of the present invention. In this embodiment, the vaporizer 500 includes a source material vaporizing section 510, spray means 520, and a delivery part 530. The source material vaporizing section 510 has a sidewall 511, a vaporizing surface 511A forming the inner surface of the sidewall 511, and heating means 512, such as a heater, embedded in the sidewall 511. The spray means 520 has a source material supply pipe 521, a spray gas supply pipe 522, and a spray nozzle 523.

The spray nozzle 523 is configured to spray the source material, using the pressure of the spray gas. The source material and spray gas are respectively supplied into the spray nozzle 523, and the source material is sprayed from a plurality of (three in the example shown in the figure) spray ports 523a along with the spray gas. Specifically, the supplied source material is divided by a source material distribution cell 523s into a plurality of source material supply passages 523v. The source material supply passages 523v communicate with the spray ports 523a. The spray gas is divided by the spray gas distribution cell 523t into passages respectively disposed to be coaxial with the source material supply passages 523v. The spray gas assists to spray the source material supplied through the respective source material supply passages 523v from the spray ports 523a. As described above, a plurality of spray ports 523a are used to spray the source material, so as to increase the source material feed rate and thus the amount of mist. Further, even where the spray amount is increased, mist can be sprayed with a uniform diameter. Accordingly, the vaporization efficiency of the source material is improved, and the residual mist and particles are reduced.

In the example shown in the figure, only one source material supply pipe 521 is used to supply the source material into the spray nozzle 523, but a plurality of source material supply pipes 521 may be used, as needed. In this case, source materials of different types may be supplied through a plurality of source material supply pipes 521 and mixed within the spray nozzle 523 immediately before being sprayed. This mixture can be then divided into a plurality of spray ports 523a along with the spray gas, and sprayed therefrom (matrix spray).

The vaporizing surface 511A formed of the inner surface of the sidewall 511 is almost spherical (hemispherical) and disposed opposite the spray direction of the spray nozzle 523. With this arrangement, the distance from the spray ports 523a to the vaporizing surface 511A is almost constant without reference to the mist spray direction. Consequently, the mist sprayed from the spray nozzle 523 can be efficiently vaporized because, e.g., the amount of mist sprayed onto the vaporizing surface 511A or spherical surface is essentially uniform.

The delivery part 530 according to this embodiment has a sidewall 531 and a honeycomb filter member 532 disposed on the inner side thereof. The sidewall 531 has a gas material delivery passage 531a formed therein. The filter member 532 has a reception through hole (or reception hole, hereinafter) 532a formed therein and extending in a direction across the flow direction of the gas material. The reception hole 532a may be formed essentially perpendicular to the flow direction of the gas material, so that residual mist and solid substances come into contact with the filter member and are re-vaporized thereon. Heating means 533, such as a heater, is disposed on the peripheral side of the reception hole 532a. The filter member 532 further has a number of fine holes 532b penetrating therethrough in the flow direction of the gas material. The fine holes 532b connect the vaporizing space 510A to an internal space 530A of the delivery part 530.

In this embodiment, the filter member 532 is disposed on the side of the vaporizing space 510A closer to the spray nozzle 523. Specifically, the filter member 532 is disposed around the spray nozzle 523 to face the vaporizing surface 511A. The internal space 530A of the delivery part 530 is defined behind (back side) the spray nozzle 523 in the spray direction. Further, the gas material delivery passage 531a is formed behind the internal space 530A. With this arrangement, the mist sprayed from the spray nozzle 523 is prevented from being directly deposited on the filter member 523. In this case, there is no need to use the shield plate 134 of the first embodiment.

The filter member 532 is essentially uniformly heated by the heating means 533 embedded therein. Accordingly, when fine residual mist contained in the gas material generated by the vaporizing surface 511A within the vaporizing space 510A is deposited on the filter member 532, it is re-vaporized thereon. The gas material flows through the fine holes 532b into the internal space 530A, and is then delivered through the gas material delivery passage 531a. The fine holes 532b formed in the filter member 532 are designed in accordance with the same dimensions as those of the second embodiment.

In this embodiment, a filter member 534 is preferably disposed within the internal space 530A (between the filter member 532 and gas material delivery passage 531a), as shown by broken lines. The filter member 534 may be the same as the filter member of the first embodiment or fifteenth embodiment. Preferably, at positions other than the peripheral portion, the filter member 534 is fixed to and in thermal contact with heat transfer portions, which protrude from the sidewall 531, as in the first embodiment. In this case, this heat transfer portions are configured to transfer heat from the filter member 532 to the filter member 534. Heating means may be embedded in the sidewall 531, while the heat transfer portions are attached to the sidewall 531 and are in thermal contact with the filter member 534.

Figure 20D:
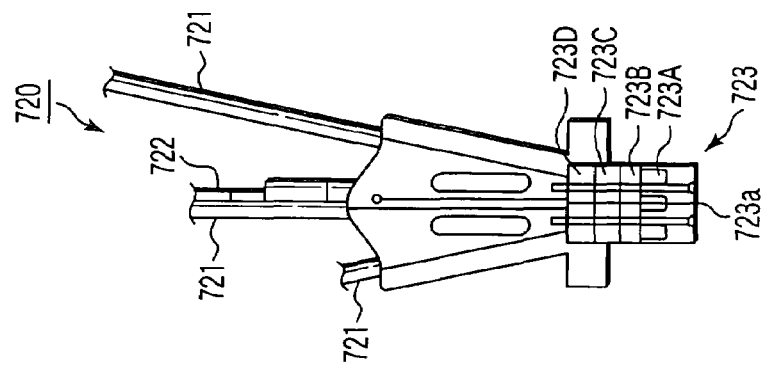
FIGS. 20C and 20D are a schematic front view and a schematic side view, respectively, showing another modification of spray means.
Figure 20C:
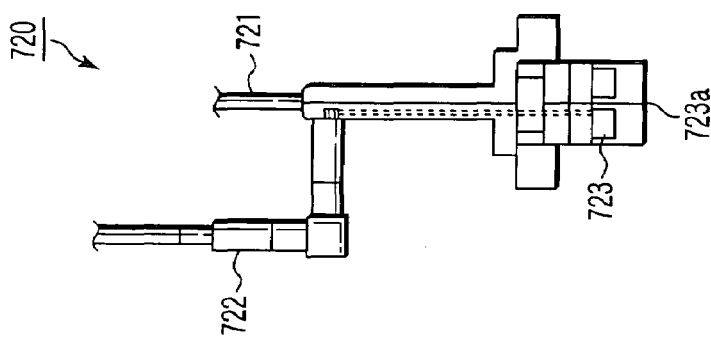
Figure 20B:
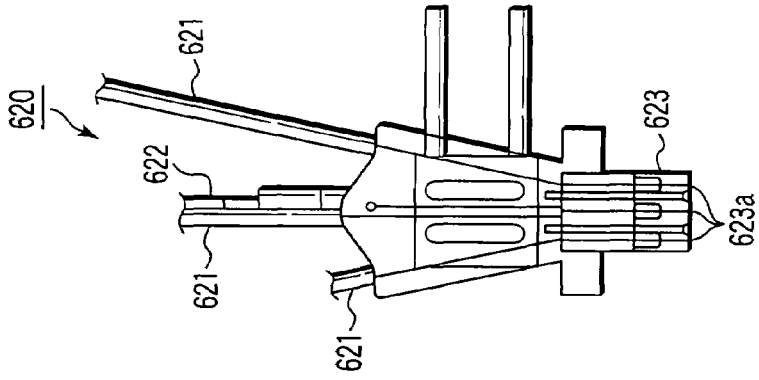
FIGS. 20A and 20B are a schematic front view and a schematic side view, respectively, showing a modification of spray means.
Figure 20A:
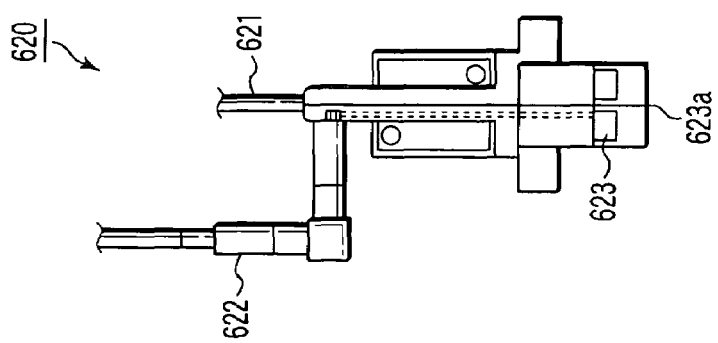

FIGS. 20A and 20B are a schematic front view and a schematic side view, respectively, showing a modification of spray means. This spray means 620 includes a plurality of (three in the example shown in the figure) source material supply pipes 621, a spray gas supply pipe 622, and a spray nozzle 623. Source materials supplied through the source material supply pipes 621 are independently prepared by mixing in the spray nozzle 623, and sprayed from respective spray ports 623a along with corresponding parts of the spray gas. For example, this structure is applied to a case where three gas materials (derivatives of Pb, Zr, and Ti (organic metal compounds)) are supplied to form PZT (lead zirconate-titanate). In this case, the three source materials are supplied into the spray means 620, and independently prepared by mixing within the spray nozzle 623. Then, three source materials are sprayed from respective spray ports 623a along with corresponding parts of the spray gas.

The spray means 620 can provide the same effect as the spray means 520 of the nineteenth embodiment. Further, the spray ports 623a are disposed exclusively for respective source materials, so the source materials can be advantageously adjusted in spray conditions (such as the source material spray amount, mixture spray gas amount, and spray pressure).

FIGS. 20C and 20D are a schematic front view and a schematic side view, respectively, showing another modification of spray means. This spray means 720 includes a plurality of source material supply pipes 721, a spray gas supply pipe 722, and a spray nozzle 723. The spray nozzle 23 is provided with gas material introduction blocks 723B to 723D, which correspond to and communicate with a plurality of source material supply pipes 721. Source materials supplied through the source material supply pipes 721 respectively flow from the gas material introduction blocks 723D, 723C, and 723B into a passage connected to a spray port 723a, and are mixed with each other within the spray nozzle 723. Then, the source materials are sprayed from the spray port 723a along with a spray gas coaxially supplied through a spray gas distribution cell 723A.

The spray means 720 can uniformly mix source materials of different types. The mixed source materials are vaporized in a vaporizing space and supplied into a film formation chamber. In this case, reproducibility of the film composition ratio is improved.

Figure 21:
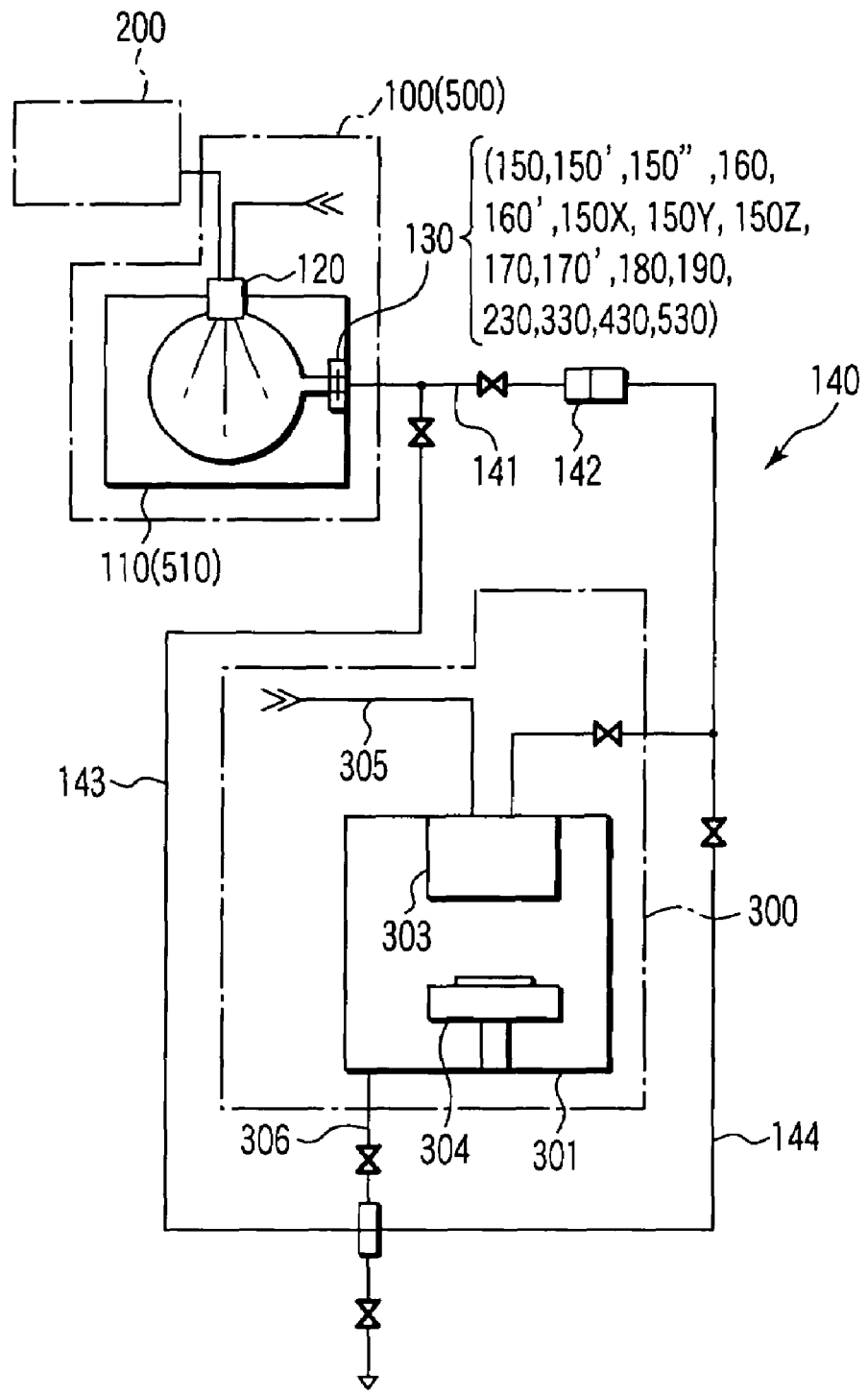
FIG. 21 is a schematic structural view showing a processing apparatus (semiconductor processing apparatus) according to an embodiment of the present invention.

FIG. 21 is a schematic structural view showing a reaction processing apparatus (semiconductor processing apparatus) according to an embodiment of the present invention. For example, this reaction processing apparatus is a CVD apparatus for forming a thin film, using a gas material. This reaction processing apparatus includes a source material supply section 200, a vaporizer 100 (500) configured to vaporize a source material supplied from the source material supply section 200, and a reaction processing section 300 configured to perform a process using a gas material generated by the vaporizer.

Figure 22:
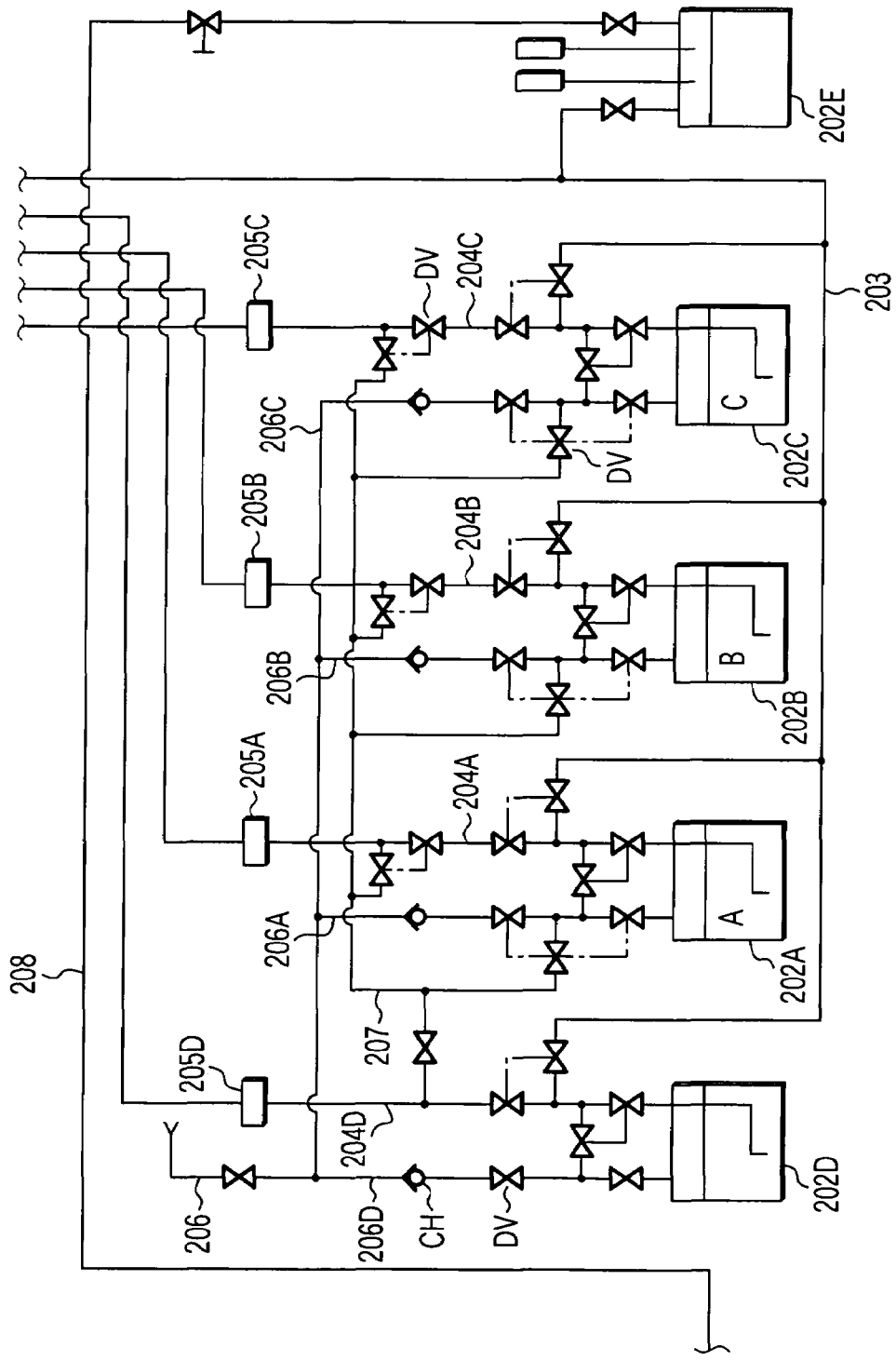
FIG. 22 is a schematic structural view showing the inner structure of a source material supply section.

FIG. 22 is a schematic structural view showing the inner structure of the source material supply section 200. The source material supply section 200 has source material containers 202A to 202C storing source materials A to C, from which the source materials A to C are supplied at controlled flow rates to the vaporizer 100 (500) through liquid feed lines 204A to 204C. For example, the source material containers 202A to 202C store materials for semiconductor devices, such as Pb, Zr, and Ti (PZT), or Pb, Zr, Ti, and Nb (PZTN), in a case where a ferroelectric thin film is formed; organic metal compounds of Ba, Sr, and Ti in a case where a high dielectric thin film is formed; or Bi, Sr, and Cu in a case where a superconducting thin film is formed. The number of source materials and source material containers is not limited to that of the example shown in the figure, and it may be arbitrarily selected as needed. A solvent container 202D is disposed to store a solvent which is to be supplied through a liquid feed line 204D. Further, a drain container 202E is connected through drain lines 203 to the liquid feed lines 204A to 204D extending from the source material container 202A to 202C and solvent container 202D.

One side ends of the liquid feed lines 204A to 204D are respectively inserted into the liquids within the source material containers 202A to 202C and solvent container 202D. The liquid feed lines 204A to 204D are respectively provided with flow rate adjusting means (for example, a flow rate controller, such as a mass flow meter) 205A to 205D on downstream sides therefrom. The liquid feed lines 204A to 204D further extend downstream from the flow rate adjusting means to supply the source materials to the vaporizer 100 (500). The flow rate adjusting means 205A to 205D are configured to receive control signals from a controller (not shown) and thereby adjust the flow rates.

The source material supply section 200 further has a gas feed line 206 for feeding an inactive gas or the like, and gas supply lines 206A to 206D branched therefrom. The gas supplied through the gas supply lines 206A to 206D applies pressure to deliver the source materials A to C and solvent to the respective liquid feed lines 204A to 204D. The liquid feed line 204D for supplying the solvent is connected through a solvent feed line 207 to the liquid feed lines 202A to 202C for supplying the source materials, and the gas supply line 206A to 206C. Further, an exhaust apparatus (not shown) is connected through a vacuum line 208 to the drain container 202E.

The gas supply lines 206A to 206D are respectively provided with check valves CH, and all lines are respectively provided with switch valves DV (diaphragm valves) at suitable positions, as shown in FIG. 22. Further, the source material feed lines are preferably provided with separators (de-aerators: not shown) upstream the flow rate adjusting means 205A to 205D.

Referring to FIG. 21 again, according to the vaporizer 100 (500), a source material vaporized within a vaporizing chamber 110 (510) is delivered through a delivery part 130 (or 150, 150', 150'', 160, 160', 150X, 150Y, 150Z, 170, 170', 180, 190, 230, 330, 430, or 530) to a source material feed line 140.

The source material feed line 140 includes a source material supply passage 141, and exhaust passages 143 and 144 connected to an exhaust system (for example, a vacuum pump). The source material supply passage 141 is provided with a gas material re-vaporize filter 142 including the filter member described above (133, 153, 153', 163, 153X, 153Z, 173, 183, 193, 232, 334, 433, or 532). The re-vaporize filter 142 has the same structure as the delivery part described above (130, 150, 150', 150'', 160, 160', 150X, 150Y, 150Z, 170, 170', 180, 190, 230, 330, 430, or 530). Specifically, the re-vaporize filter 142 is formed independently of a vaporizer, although it has the same structure as the delivery part, while each of the gas material supply sections described previously is formed as a part of a vaporizer. The gas material supply structure may be provided with only one of the delivery part and re-vaporize filter 142.

The processing section 300 includes a reaction chamber 301, in which a susceptor 304 is disposed to place a target substrate, such as a semiconductor wafer, thereon. A gas feed portion (showerhead) 303 is disposed within the reaction chamber 301 to face the susceptor 304. The gas material supplied from the vaporizer 100 (500) is delivered (along with a suitable carrier gas) through the showerhead 303 into the reaction chamber 301. Further, a reaction gas (for example, an oxidizing gas, such as oxygen gas) supplied from another gas feed line 305 is delivered through the showerhead 303 into the reaction chamber 301. An exhaust line 306 is connected to the reaction chamber 301 to exhaust the interior of the reaction chamber 301.

According to this reaction processing apparatus, the amount of mist and particles entering the reaction chamber 301 can be remarkably reduced by the delivery part of the vaporizer (130, 150, 150', 150'', 160, 160', 150X, 150Y, 150Z, 170, 170', 180, 190, 230, 330, 430, or 530) or the re-vaporize filter 142. Consequently, the quality of a process performed within the reaction chamber 301 (for example, a film formation process) is improved. In the delivery part and re-vaporize filter, a filter member disposed therein is uniformly heated, so it increases the vaporization efficiency and is prevented from being clogged. It follows that the maintenance of the feed line is less frequency, while the conductance of the feed line is maintained.

Figure 23:
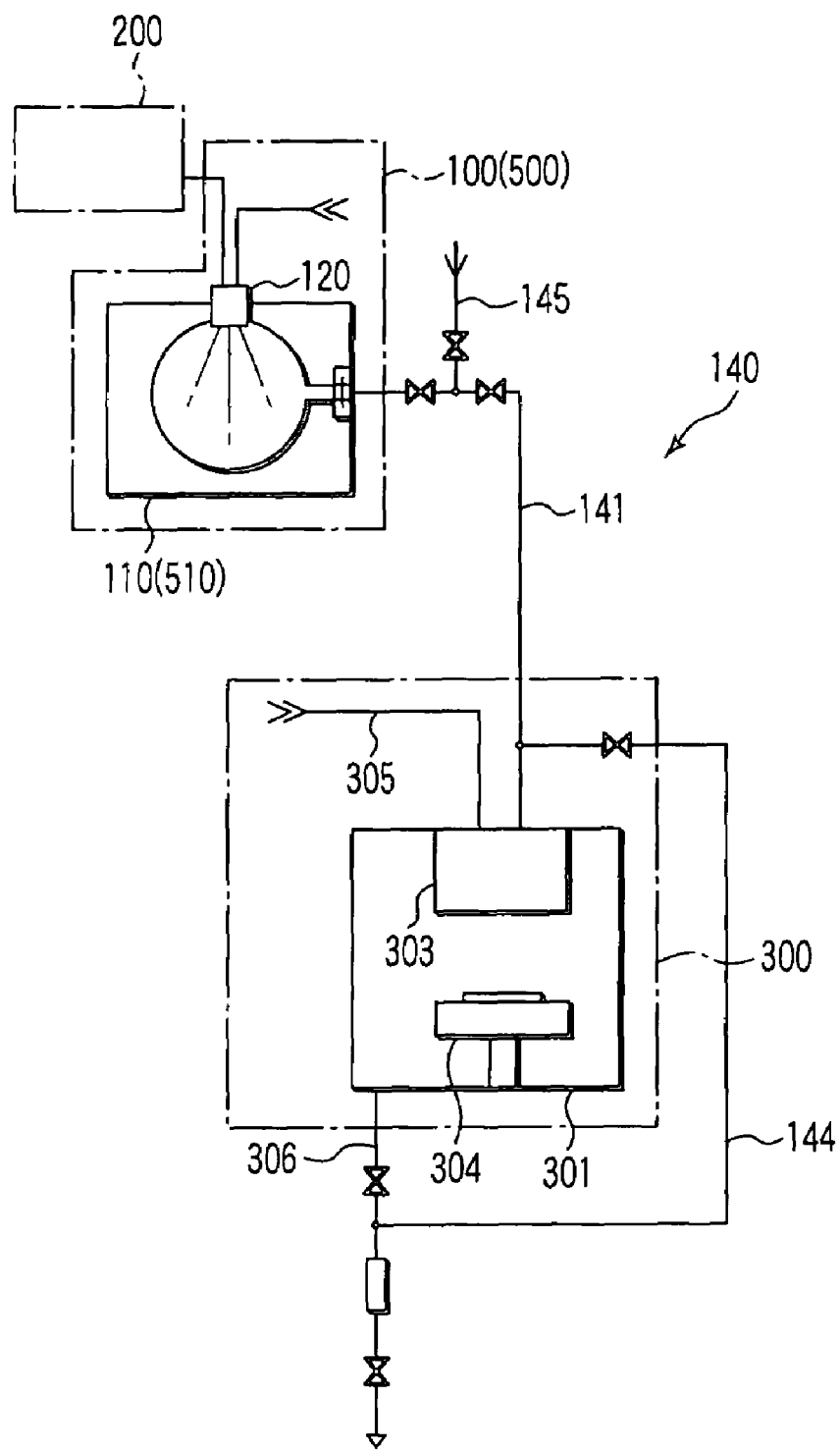
FIG. 23 is a schematic structural view showing a processing apparatus (semiconductor processing apparatus) according to another embodiment of the present invention.

FIG. 23 is a schematic structural view showing a reaction processing apparatus (semiconductor processing apparatus) according to another embodiment of the present invention. This structure is the same as the structure described above, in that a source material is supplied from a source material supply section 200 to a vaporizer 100 (500), and a gas material is supplied from the vaporizer 100 (500) through a source material supply passage 141 to a processing section 300. On the other hand, this structure differs from the structure described above, in that a purge line 145 for supplying an inactive gas, such as Ar gas, is connected to the source material supply passage 141. Further, this structure does not include the re-vaporize filter 142 and exhaust passage 143.

According to this structure, the distance between the vaporizer 100 (500) and reaction chamber 301 (the length of the source material supply passage 141) is set to be as short as possible, so that the amount of vaporized gas within the source material supply passage is small. With this arrangement, generation of particles is suppressed in the source material supply system, and thus the quality of a film formed within the reaction chamber 301 is improved.

FIG. 24 is a graph showing change with time in the pressure inside a vaporizing chamber (dependency of the inner pressure on the source material supply period), comparing the vaporizer according to the second embodiment with a conventional vaporizer (including a filter member disposed in a conventional manner).

As indicated with a line L2, the conventional vaporizer went beyond the upper limit pressure before the source material supply period reached 100 hours. In this case, the vaporizer was then subjected to a purge treatment of supplying an inactive gas, such as N$_2$, while heating the vaporizer, to temporally decrease the inner pressure. However, the vaporizer went beyond the upper limit pressure again in a short time thereafter (FIG. 24 does not show the purge treatment period). This was thought to be caused due to a large amount of solid substances being deposited on the filter member, which decreased the conductance.

On the other hand, as indicated with a line L1, the vaporizer according to the second embodiment showed a pressure far lower than the upper limit pressure even after the source material supply period reached 600 hours. Accordingly, it has been found that the vaporizer according to the second embodiment can remarkably suppress decrease in the conductance, as compared to the conventional structure. In the case of the second embodiment, decrease in the conductance was hardly observed, but this does not mean malfunction of the filter member. Rather than this, it was experimentally confirmed that the second embodiment reduced the amount of particles entering the reaction chamber to a half or less of that observed in the conventionally structure.

Particularly, in the case of the conventionally structure, the amount of particles entering the reaction chamber was mainly reduced by an inline filter disposed downstream. In contrast, in the case of the second embodiment, the amount of particles entering the reaction chamber scarcely changed, when an inline filter disposed downstream was detached. This was thought to be caused because the vaporizer according to the second embodiment reduced the amount of particles to such a low level that was scarcely influenced by whether the inline filter was present or not.

As shown in FIG. 24, in the case of the second embodiment, the inline filter disposed downstream was detached when the source material supply period reached about 170 hours (corresponding to the broken line in FIG. 24), and measurement of the inner pressure change was continued. As a result, the inner pressure was slightly decreased after 170 hours as shown in the graph. Accordingly, it was demonstrated that the second embodiment remarkably suppressed decrease in the conductance due to clogging of the filter member, and greatly reduced the amount of particles flowing downstream.

According to the present invention, the supply structure, vaporizer, and reaction processing apparatus associated with a gas material are not limited to the examples shown in the figures, and they may be modified in various manners without departing from the spirit and scope of the present invention. For example, the respective features of the sidewall, internal space, heating means, filter member, shield plate, heat transfer portions (heat transfer columns), and communication clearance in one embodiment are not limited to their combination shown in that embodiment, and they may be applied to another embodiment, independently of each other.

INDUSTRIAL APPLICABILITY

According to the present invention, there is provided a vaporizer that can decrease mist and particles in a gas material.

The invention claimed is:

1. A vaporizer comprising:
a vaporizing chamber including a vaporizing surface configured to vaporize a liquid material;
a spray portion configured to spray the liquid material in the vaporizing chamber;
a delivery part attached to the vaporizing chamber and including a gas outlet to deliver a gas material generated inside the vaporizing chamber to a process chamber through a gas feed line;
first heating portion configured to heat the vaporizing chamber; and
a second heating portion configured to heat a wall of the delivery part,
wherein the delivery part comprises
a filter member covering the gas outlet and including a peripheral portion set in thermal contact with and fixed to the wall of the delivery part, and
a heat transfer member set in thermal contact with the filter member at a position other than a peripheral portion and configured to transfer heat of the second heating portion to the filter member,
wherein the second heating portion and the filter member are separated from each other, and the heat transfer member is disposed between the second heating portion and the filter member and supports the filter member,
wherein the vaporizer further comprises a shield plate covering the filter member and disposed farther from the gas outlet than is disposed the filter member, and
wherein the shield plate is fixed to the heat transfer member along with the filter member with a spacer interposed between the shield plate and the filter member such that the shield plate receives heat through the heat transfer member and the spacer from the second heating portion.

2. The vaporizer according to claim 1, further comprising a control member configured to control temperature of the second heating portion based on temperature of the heat transfer member or the filter member.

3. The vaporizer according to claim 1, wherein the heat transfer member comprises a plurality of heat transfer members.

4. The vaporizer according to claim 1, further comprising a heater incorporated in the heat transfer member.

5. The vaporizer according to claim 1, wherein the spacer is disposed to form a heated gas passage, between the filter member and the shield plate, for delivering the gas material to the gas outlet.

6. The vaporizer according to claim 5, wherein a clearance is formed around the shield plate to allow the vaporizing chamber to communicate with the gas passage.

7. The vaporizer according to claim 6, wherein the shield plate is disposed to cover the filter member entirely in plane.

8. The vaporizer according to claim 5, wherein an opening is formed in the shield plate to allow the vaporizing chamber to communicate with the gas passage.

9. The vaporizer according to claim 8, wherein the opening comprises a slit, which is bent in a thickness direction of the shield plate.

10. The vaporizer according to claim 1, further comprising a control member configured to control temperature of the second heating portion based on temperature of the filter member or the shield plate.

11. The vaporizer according to claim 10, wherein the temperature of the filter member or the shield plate is set at substantially the same as the temperature of the first heating portion.

12. The vaporizer according to claim 10, further comprising a temperature sensor disposed at the shield plate, wherein the control member is configured to control the temperature of the second heating portion based on a signal detected by the sensor.

13. The vaporizer according to claim 1, further comprising a heater incorporated in the shield plate.

14. An apparatus for performing a semiconductor process on a target substrate, the apparatus comprising:
a process chamber configured to accommodate the target substrate; and
a gas supply system configured to supply a process gas into the process chamber,
wherein the gas supply system comprises the vaporizer according to claim 1.

15. The vaporizer according to claim 1, wherein the shield plate is interposed between the vaporizing chamber and the filter member to prevent the gas material, which flows toward the gas outlet, from directly reaching the filter member while traveling in a straight path from the vaporizing chamber.

16. The vaporizer according to claim 1, wherein the heat transfer member comprises columns disposed on the wall of the delivery part.

17. The vaporizer according to claim 16, wherein the first heating portion comprises a heater embedded in a wall of the vaporizing chamber.

18. The vaporizer according to claim 1, wherein the second heating portion comprises a heater embedded in the wall of the delivery part.

19. The vaporizer according to claim 1, wherein the heat transfer member is formed to protrude from the wall of the delivery part.

20. The vaporizer according to claim 1, wherein the delivery part further comprises an exhaust passage.

21. A vaporizer comprising:
a vaporizing chamber including a vaporizing surface configured to vaporize a liquid material;
a spray portion configured to spray the liquid material in the vaporizing chamber;
a delivery part including a gas outlet to deliver a gas material generated inside the vaporizing chamber to a process chamber through a gas feed line; and
a heating portion configured to heat the vaporizer,
wherein the delivery part comprises
a plate member covering the gas outlet and a wall around the gas outlet, with a gap therebetween to form a communication clearance, the plate member having a first face facing the vaporizing chamber and a second face opposite thereto and facing the wall such that a gas passage connecting the vaporizing chamber to the gas outlet is formed between the second face and the wall,
a heater embedded in the plate member; and
a plurality of heat transfer columns extending from the second face of the plate member to the wall and configured to transfer heat to the gas material flowing through the gas passage to vaporize residual mist, the heat transfer columns being distributed in the gas passage
a filter member disposed between the gas outlet and the plate member and configured to allow the gas material to pass therethrough.

22. The vaporizer according to claim 21, wherein the first face of the plate member is directly exposed to the vaporizing chamber and configured to serve as a vaporizing surface for vaporizing the liquid material.

23. The vaporizer according to claim 21, further comprising a temperature control section configured to control temperature of the heater based on temperature of the plate member.

24. An apparatus for performing a semiconductor process on a target substrate, the apparatus comprising:
a process chamber configured to accommodate the target substrate; and
a gas supply system configured to supply a process gas into the process chamber,
wherein the gas supply system comprises the vaporizer according to claim 21.

25. The vaporizer according to claim 21, wherein the plurality of heat transfer columns are arrayed in a staggered pattern.

26. The vaporizer according to claim 21, further comprising a heating member embedded in the wall.

27. The vaporizer according to claim 21, wherein the plate member includes an attachment portion extending from the second face and attached to a delivery part wall of the delivery part.

28. The vaporizer according to claim 27, wherein the attachment portion is fitted in a recessed portion formed in the delivery part wall.

29. The vaporizer according to claim 27, wherein the delivery part is attached to the vaporizing chamber.

30. The vaporizer according to claim 21, wherein the heat transfer columns are arranged to serve as a fluid baffle and prevent the gas material, which flows toward the gas outlet, from directly reaching the gas outlet while traveling in a straight path from the communication clearance.

* * * * *